(12) United States Patent
Sasaki et al.

(10) Patent No.: US 8,426,946 B2
(45) Date of Patent: Apr. 23, 2013

(54) LAMINATED SEMICONDUCTOR SUBSTRATE, LAMINATED CHIP PACKAGE AND METHOD OF MANUFACTURING THE SAME

(75) Inventors: Yoshitaka Sasaki, Milpitas, CA (US); Hiroyuki Ito, Milpitas, CA (US); Atsushi Iijima, Shatin (CN)

(73) Assignees: Headway Technologies, Inc., Milpitas, CA (US); SAE Magnetics (H.K.) Ltd., Hong Kong (CN)

( * ) Notice: Subject to any disclaimer, the term of this patent is extended or adjusted under 35 U.S.C. 154(b) by 409 days.

(21) Appl. No.: 12/801,837

(22) Filed: Jun. 28, 2010

(65) Prior Publication Data

US 2011/0316123 A1    Dec. 29, 2011

(51) Int. Cl.
*H01L 23/02*    (2006.01)

(52) U.S. Cl.
USPC .... 257/620; 257/686; 257/774; 257/E23.085; 257/E23.179; 438/109; 438/462

(58) Field of Classification Search .................. 257/620, 257/621, 686, 774, E23.085, E23.179; 438/109, 438/462
See application file for complete search history.

(56) References Cited

U.S. PATENT DOCUMENTS

2010/0225000 A1*  9/2010  Sugizaki et al. ............. 257/773

FOREIGN PATENT DOCUMENTS

| JP | A-64-53440 | 3/1989 |
|----|------------|--------|
| JP | A-2002-246540 | 8/2002 |
| JP | A-2003-7909 | 1/2003 |
| JP | A-2003-163324 | 6/2003 |
| JP | A-2005-26582 | 1/2005 |
| JP | A-2007-234881 | 9/2007 |
| JP | A-2008-187061 | 8/2008 |
| JP | A-2009-111384 | 5/2009 |
| JP | A-2009-521116 | 5/2009 |
| JP | A-2010-016375 | 1/2010 |

* cited by examiner

*Primary Examiner* — Minh-Loan T Tran
(74) *Attorney, Agent, or Firm* — Oliff & Berridge, PLC

(57) ABSTRACT

In a laminated semiconductor substrate, a plurality of semiconductor substrates are laminated. Each of the semiconductor substrate has a plurality of scribe-groove parts formed along scribe lines. Further, each of the semiconductor substrate has a plurality of device regions insulated from each other and has a semiconductor device formed therein, a first wiring electrode and a second wiring electrode extend to the inside of a interposed groove part from a first device region and a second device region respectively, and are separated from each other. In the laminated semiconductor substrate, a through hole which the first wiring electrode appears is formed. The laminated semiconductor substrate has a through electrode. The through electrode is contact with all of the first wiring electrodes appearing in the through hole. The laminated semiconductor substrate has a plurality of laminated chip regions.

22 Claims, 30 Drawing Sheets

Fig.27
(a) 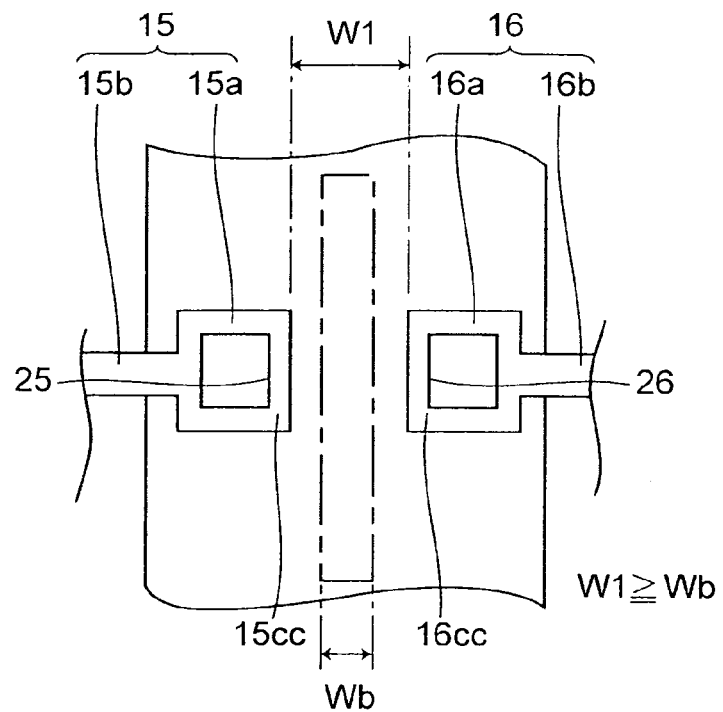
(b) 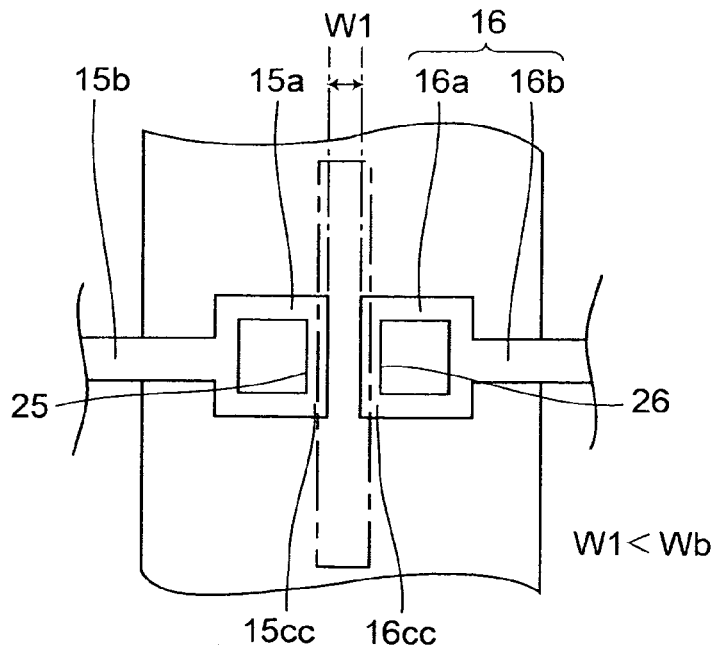

Fig.28
(a)
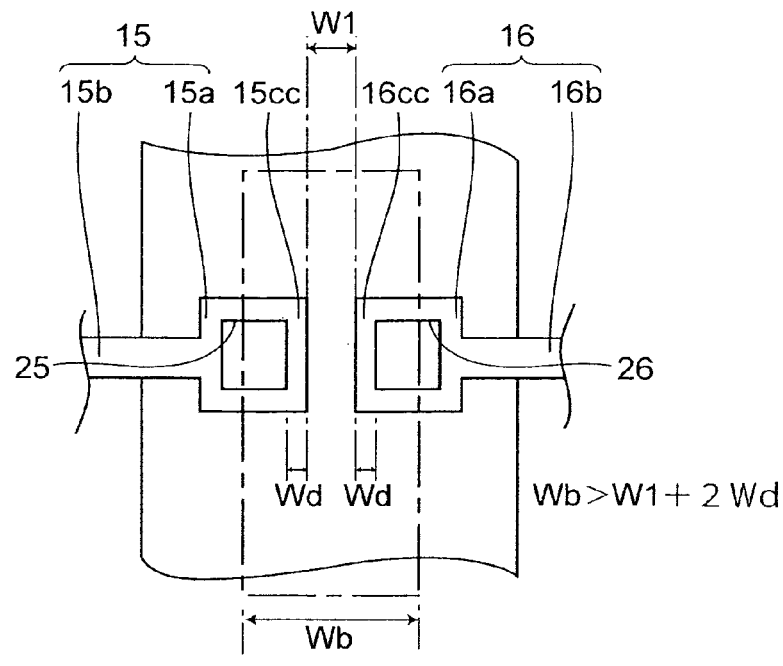
Wb > W1 + 2Wd
(b)
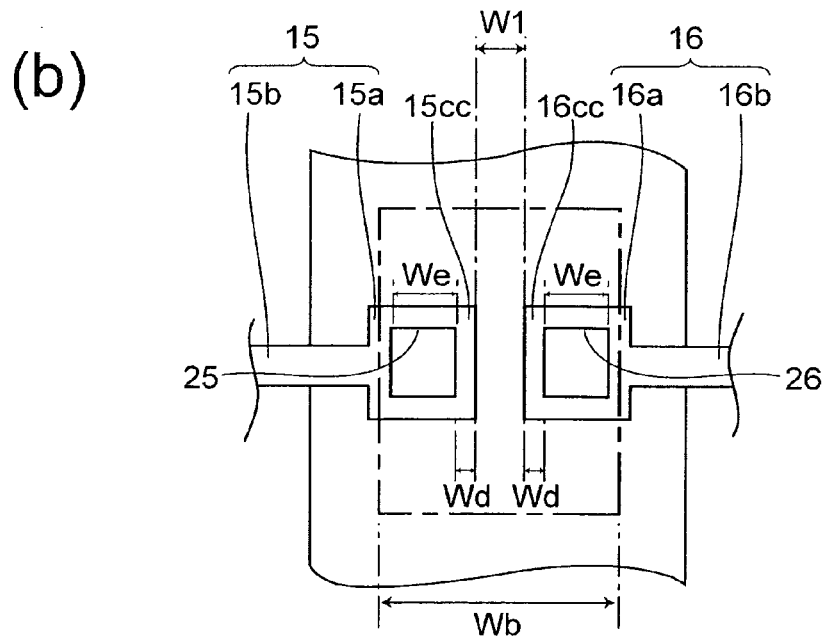
Wb > W1 + 2Wd + 2We

LAMINATED SEMICONDUCTOR SUBSTRATE, LAMINATED CHIP PACKAGE AND METHOD OF MANUFACTURING THE SAME

BACKGROUND

1. Field of the Invention

The present invention relates to a laminated semiconductor substrate for manufacturing a laminated chip package including a plurality of laminated semiconductor chips, a laminated chip package and a method of manufacturing the same.

2. Related Background Art

In recent years, electronic devices such as cellular phones and notebook personal computers need to be reduced in weight and improved in performance. With such needs, higher integration of electronic components used for the electronic devices has been required. Further, the higher integration of electronic components has been required also for increase in capacity of a semiconductor memory device.

Recently, System in Package (hereinafter referred to as a "SIP") has attracted attention as a highly integrated electronic component. The SIP is a device created by stacking a plurality of LSIs and mounting them in one package, and a SIP using the three-dimensional mounting technique of laminating a plurality of semiconductor chips has received attention recently. Known as such a SIP is a package having a plurality of laminated semiconductor chips, that is, a laminated chip package. The laminated chip package has an advantage that speed up of operation of circuits and reduction in stray capacitance of wiring become possible because the length of the wiring can be reduced as well as an advantage of capability of high integration.

Known as the three-dimensional mounting techniques for manufacturing the laminated chip package include a wire bonding system and a through electrode system. The wire bonding system is a system of laminating a plurality of semiconductor chips on a substrate and connecting a plurality of electrodes formed on each of the semiconductor chips and external connecting terminals formed on the substrate by wire bonding. The through electrode system is a system of forming a plurality of through electrodes in each of the laminated semiconductor chips and realizing wiring between the respective semiconductor chips by the through electrodes.

The wire bonding system has a problem of a difficulty in reducing the spaces between the electrodes in a manner that the wires are not in contact with each other, a problem of a difficulty in speeding up the operation of circuits because of a high resistance value of wires, and a problem of a difficulty in reducing the thickness.

Though the above-described problems in the wire bonding system are solved in the through electrode system, the through electrode system has a problem of increased cost of the laminated chip package because many processes are required for forming the through electrodes in each of the semiconductor chips.

Conventionally as methods of manufacturing the laminated chip package, for example, techniques disclosed in Japanese Patent Application Laid-Open No. 2003-163324 (referred also to as patent document 1), Japanese Patent Application Laid-Open No. 2003-7909 (referred also to as patent document 2), Japanese Patent Application Laid-Open No. 2008-187061 (referred also to as patent document 3), Japanese Patent Application Laid-Open No. 2007-234881 (referred also to as patent document 4) are known.

The patent document 1 discloses a laminated-type semiconductor device in which a plurality of layers of unit semiconductor devices having identical semiconductor chips are laminated. In the laminated-type semiconductor device, an insulating resin layer with through holes is formed around the semiconductor chips. In the through hole, a wiring plug is formed. The wiring plug extends from the front surface to the rear surface of the semiconductor chip, and an external electrode is connected to the front surface. Further, a wiring pattern is connected to the rear surface. One wiring pattern is formed for each laminated-type semiconductor device, and another wiring pattern is formed across adjacent laminated-type semiconductor devices to be shared between the adjacent laminated-type semiconductor devices (see FIG. 1, FIG. 2 and so on).

Besides, the patent document 2 discloses a laminated-type semiconductor device having a structure in which a plurality of semiconductor devices having through electrodes which reach the rear surface from the front surface provided therearound are laminated (see FIG. 47). The patent document 3 discloses a laminated memory in which a plurality of memory chips having through holes formed inside the peripheral edge part are laminated (see FIG. 6 and so on). Furthermore, the patent document 4 discloses a semiconductor device in which semiconductor substrates having through electrodes formed inside the peripheral edge part are laminated (see FIG. 2 and so on).

SUMMARY OF THE INVENTION

As described above, a plurality of semiconductor chips are laminated and electrically connected to each other by the through electrodes in the conventional laminated chip package (laminated-type semiconductor device). In the case of the laminated-type semiconductor device in the patent document 1, the wiring plug is formed as the through electrode. Further, the wiring pattern is connected to the rear surface of the wiring plug. Therefore, a contact resistance may occur at a contact part of the wiring plug and the wiring pattern in this laminated-type semiconductor device.

On a contact surface of two articles such as the wiring plug and the wiring pattern, less current than in one conductor flows because of small concavity and convexity, an oxide coating and the like on the surfaces of the articles. The resistance caused by the concavity and convexity on the contact surface is the contact resistance.

Besides, to ship only good laminated chip packages, inspection of measuring the electrical characteristics of the whole chip, the appearance and size as a package and so on (hereinafter, referred to as "package inspection") needs to be performed on an individual laminated chip package.

However, when the wiring pattern across the adjacent laminated-type semiconductor devices is formed as in the laminated-type semiconductor device in the patent document 1, the package inspection cannot be performed for each of the laminated-type semiconductor devices. In the case of the laminated-type semiconductor device, to perform the package inspection for an individual laminated-type semiconductor device, each laminated-type semiconductor device needs to be insulated, for example, by cutting the wiring pattern.

Besides, the laminated-type semiconductor device is manufactured by first forming the wiring pattern and then laminating a plurality of semiconductor chips on the wiring pattern. Therefore, the package inspection can be performed for each semiconductor chip before the laminated-type semiconductor device is completed, but the contact resistance occurring at the contact part of the wiring pattern and the wiring plug cannot be reflected in such package inspection. Accordingly, the laminated-type semiconductor device in the patent document 1 has a structure in which the package inspection for the whole individual chip is difficult to perform.

In this regard, it becomes possible to perform the package inspection for each laminated-type semiconductor device by making a structure in which the wiring pattern is formed for each laminated-type semiconductor device or making the structure in the patent document 2.

However, since the wiring plug (through electrode) is formed for each of individual laminated semiconductor chips in the laminated-type semiconductor devices disclosed in the patent documents 1 and 2, the wiring plug (through electrode) needs to be formed for each of the laminated semiconductor chips. To this end, the process of forming the wiring plug (through electrode) needs to be repeated for each semiconductor chip.

Then, the process of forming the wiring plug (through electrode) needs to be executed for the lamination number of semiconductor chips, bringing about a problem. The problem is that the increase in the lamination number of semiconductor chips leads to an accordingly increased manufacturing time.

Therefore, a problem in the prior art is that even though the package inspection for each laminated-type semiconductor device is possible, it is difficult to reduce the manufacturing time and to increase the number of laminated-type semiconductor devices manufactured per unit time.

The present invention is made to solve the above problem, and it is an object to make it easy, in a laminated semiconductor substrate, a laminated chip package and a manufacturing method of the same, to perform the package inspection for the whole individual chip and to make it possible to increase the number of laminated chip packages manufacturable per unit time by reducing the manufacturing time.

To solve the above problem, the present invention is a laminated semiconductor substrate laminated a plurality of semiconductor substrates having a plurality of scribe-groove parts formed along scribe lines, the plurality of semiconductor substrates each including: a plurality of device regions insulated from each other, each of which is in contact with at least one of the plurality of scribe-groove parts and has a semiconductor device formed therein; and a first wiring electrode and a second wiring electrode which are connected to the respective semiconductor devices in a first device region and a second device region adjacent to each other with at least one interposed groove part of the plurality of scribe-groove parts among the plurality of device regions, and extend to the inside of the interposed groove part from the first device region and the second device region respectively, and are separated from each other, and the laminated semiconductor substrate including: a through hole formed therein which penetrates the interposed groove parts of the plurality of semiconductor substrates laminated in a laminated direction in which the plurality of semiconductor substrates are laminated, and in which a plurality of the first wiring electrodes, constituting a laminated electrode group laminated in the laminated direction among the first wiring electrodes, appear; a through electrode which penetrates all of the plurality of semiconductor substrates through the through hole and is in contact with all of the first wiring electrodes appearing in the through hole; and a plurality of laminated chip regions each of which is composed of the device regions laminated in the laminated direction in all of the plurality of semiconductor substrates.

The laminated semiconductor substrate has a plurality of laminated chip regions composed of device regions insulated from each other each having a first wiring electrode and a second wiring electrode which are connected to the respective semiconductor devices in a first device region and a second device region and separated from each other. In each laminated chip region, the plurality of device regions are connected by a through electrode. Therefore, in the laminated semiconductor substrate, the package inspection can be performed for the individual laminated chip package in a state of the wafer structure without physically separating the laminated chip regions. Further, the through hole penetrates the interposed groove parts and can be thus easily formed.

In the above-described laminated semiconductor substrate, it is preferable that where the first wiring electrodes having a common position among the first wiring electrodes in each of the plurality of semiconductor substrates are common wiring electrodes, the laminated electrode group is composed of the common wiring electrodes identical, regarding all of the plurality of semiconductor substrates.

In the above laminated semiconductor substrate, the through hole connecting, in a straight line, all of the first wiring electrodes in the plurality of semiconductor substrate is formed. The through electrode passes through the through hole and is thus formed in a straight onr-bar shape.

Further, in the above-described laminated semiconductor substrate, it is preferable that the first wiring electrode and the second wiring electrode are formed such that each of the first wiring electrode and the second wiring electrode has an electrode pad or a terminal part extending to the inside of the interposed groove part, and endmost parts of the electrode pads or the terminal parts extending to the innermost of the interposed groove part are opposed to each other.

By this formation, the position adjustment when a probe is brought into contact with the first wiring electrode is easily performed, so that the laminated semiconductor substrate has a structure in which the package inspection is accordingly easily performed.

Further, in the above-described laminated semiconductor substrate, it is preferable that the first wiring electrode has an electrode pad disposed inside of the interposed groove part and having a hole part formed along the laminated direction, and the through hole is formed in a straight line connecting all of the hole parts formed in the respective electrode pads of the plurality of the first wiring electrodes constituting the laminated electrode group.

In this laminated semiconductor substrate, the through hole is easily formed. Further, the through electrode is a conductor in a one-bar shape, and the through electrode is thus also easily formed. In addition, the laminated semiconductor substrate has a structure in which the contact resistance caused by the contact between conductors for connecting the semiconductor substrates does not occur.

In the above-described laminated semiconductor substrate, it is preferable that the plurality of scribe-groove parts are formed as through groove parts reaching a rear surface from a front surface of the semiconductor substrate, and further comprise an in-groove insulating layer formed inside of the scribe-groove parts, and the through hole is formed in a straight line penetrating all of the hole parts formed in the respective electrode pads of the plurality of the first wiring electrodes constituting the laminated electrode group, and the in-groove insulating layers laminated in the laminated direction of all of the semiconductor substrates.

This laminated semiconductor substrate has a structure in which the through hole penetrates the in-groove insulating layers but does not penetrate the semiconductor substrates, so that the through hole is more easily formed. Further, the through electrode is a conductor in a one-bar shape, and the through electrode is thus also easily formed. In addition, the laminated semiconductor substrate has a structure in which the contact resistance caused by the contact between conductors for connecting the semiconductor substrates does not occur.

In the above-described laminated semiconductor substrate, it is preferable that the whole inner surfaces facing the hole parts of the electrode pads are in contact with a peripheral surface of the through electrode, regarding all of the plurality of semiconductor substrates.

In this laminated semiconductor substrate, a larger area between the electrode pad and the through hole is secured for all of the plurality of semiconductor substrates. Further, since the electrode pad is in contact with the peripheral surface in all directions of the through electrode, the current flows more smoothly than the case where the electrode pad is in contact with the peripheral surface in a part of directions.

In the above-described laminated semiconductor substrate, it is preferable that the first wiring electrode has an electrode pad having a hole part formed along the laminated direction, and the through hole is formed along the hole part.

In this laminated semiconductor substrate, since the through hole is formed on an extension line along the hole parts, the through hole is more easily formed.

Further, in the above-described laminated semiconductor substrate, it is possible that the electrode pad is formed in a rectangular shape or in a U-shape disposed such that both end parts open toward the inside of the interposed groove part.

Further, in the above laminated semiconductor substrate, it is possible that the laminated semiconductor substrate is composed by laminating one or two or more unit laminated substrates in each of which four semiconductor substrates are laminated.

Further, the present invention provides a laminated chip package laminated a plurality of semiconductor chips having a semiconductor device, the plurality of semiconductor chips each including: a resin insulating layer made of an insulating resin formed to surround the semiconductor chip; and a wiring electrode which is connected to the semiconductor device and has an end part disposed on the resin insulating layer, and the laminated chip package including: a through hole formed therein which penetrates the resin insulating layers of the plurality of semiconductor chips laminated in a laminated direction in which the plurality of semiconductor chips are laminated, and in which a plurality of the wiring electrodes, constituting a laminated electrode group laminated in the laminated direction among the wiring electrodes, appear; and a through electrode which penetrates all of the plurality of semiconductor chips through the through hole and is in contact with all of the wiring electrodes appearing in the through hole.

In the above-described laminated chip package, it is possible that a plurality of the wiring electrodes are formed on the resin insulating layer, and where the wiring electrodes having a common position among the wiring electrodes in each of the plurality of semiconductor chips are common wiring electrodes, the laminated electrode group is composed of the common wiring electrodes identical, regarding all of the plurality of semiconductor chips.

Further, in the above-described laminated chip package, it is preferable that the wiring electrode has an electrode pad disposed on the resin insulating layer and having a hole part formed along the laminated direction, and the through hole is formed in a straight line connecting all of the hole parts formed in the respective electrode pads of the plurality of the wiring electrodes constituting the laminated electrode group.

Further, it is possible that the wiring electrode has an electrode pad disposed on the resin insulating layer and having a hole part formed along the laminated direction, and the through hole is formed in a straight line penetrating all of the hole parts formed in the respective electrode pads of the plurality of the wiring electrodes constituting the laminated electrode group, and the resin insulating layers laminated in the laminated direction of all of the semiconductor chips.

Further, it is preferable that the whole inner surfaces facing the hole parts of the electrode pads are in contact with a peripheral surface of the through electrode, regarding all of the plurality of semiconductor chips.

It is possible that the wiring electrode has an electrode pad having a hole part formed along the laminated direction, and the through hole is formed along the hole part.

Further, the present invention provides a method of manufacturing a laminated semiconductor substrate, including: a device region forming step of forming a plurality of scribe-groove parts along scribe lines in an unprocessed substrate having semiconductor devices formed therein to form a plurality of device regions each of which is in contact with at least one of the plurality of scribe-groove parts and has the semiconductor device formed therein; a substrate manufacturing step of manufacturing a substrate with electrode by forming a first wiring electrode and a second wiring electrode which are connected to the respective semiconductor devices in a first device region and a second device region adjacent to each other with at least one interposed groove part of the plurality of scribe-groove parts among the plurality of device regions, and extend to the inside of the interposed groove part from the first device region and the second device region respectively, and are separated from each other; a laminating step of laminating a plurality of the substrates with electrode to manufacture a laminated wafer; a through hole forming step of forming, in the laminated wafer, a through hole which penetrates the interposed groove parts of the plurality of substrates with electrode laminated in a laminated direction in which the plurality of substrates with electrode are laminated, and in which a plurality of the first wiring electrodes, constituting a laminated electrode group laminated in the laminated direction among the first wiring electrodes, appear; and a through electrode forming step of forming a through electrode in contact with all of the first wiring electrodes appearing in the through hole such that the through electrode penetrates all of the plurality of substrates with electrode through the through hole.

In the above-described method of manufacturing, it is preferable that in the substrate manufacturing step, the first wiring electrode and the second wiring electrode are formed such that each of the first wiring electrode and the second wiring electrode has an electrode pad or an extended terminal part extending to the inside of the interposed groove part, and endmost parts of the electrode pads or the extended terminal parts extending to the innermost of the interposed groove part are opposed to each other.

Further, in the above-described method of manufacturing, it is preferable that in the substrate manufacturing step, the first wiring electrode is formed in a shape having an electrode pad disposed inside the interposed groove part and having a hole part formed along the laminated direction, and in the through hole forming step, the through hole is formed in a straight line connecting all of the hole parts formed in the respective electrode pads of the plurality of the first wiring electrodes constituting the laminated electrode group.

Further, in the above-described method of manufacturing, it is preferable that further including: an insulating layer forming step of forming an in-groove insulating layer made of an insulating resin inside the plurality of scribe-groove parts, and in the through hole forming step, the through hole is formed in a straight line penetrating all of the hole parts formed in the respective electrode pads of the plurality of the first wiring electrodes constituting the laminated electrode group, and the in-groove insulating layers laminated in the laminated direction of all of the semiconductor substrates.

Further, in the above-described method of manufacturing, it is preferable that in the through hole forming step, the through hole is formed such that the whole inner surfaces facing the hole parts of the electrode pads appear in the through hole.

Further, the present invention provides a method of manufacturing a laminated chip package, including the step of: cutting the laminated semiconductor substrate manufactured by the above-described method of manufacturing along the scribe-groove parts to cause resin insulating layers made of an insulating resin to appear in a cut surface to manufacture laminated chip packages.

In the above-described method of manufacturing, it is preferable that when cutting the laminated semiconductor substrate, the cutting is performed in a space between the first wiring electrodes and the second wiring electrodes in the laminated semiconductor substrate.

The present invention will be more fully understood from the detailed description given hereinbelow and the accompanying drawings which are given by way of illustration only, and thus are not to be considered as limiting the present invention.

BRIEF DESCRIPTION OF THE DRAWINGS

FIG. 27 is a view illustrating an example of a relation of blade and wiring electrode, in which (a) shows a case of W1≧Wb, and (b) shows a case of W1<Wb;

FIG. 28 is a view illustrating an example of a relation of blade and wiring electrode, in which (a) shows a case of Wb>W1+2Wd, and (b) shows a case of Wb>W1+2Wd+2We;

DETAILED DESCRIPTION OF THE EMBODIMENTS

In the following, embodiments of the present invention will be described with reference to the drawings. Note that the same components will be referred to with the same numerals or letters, while omitting their overlapping descriptions.

First Embodiment

Structure of Laminated Semiconductor Wafer 100

To begin with, the structure of a laminated semiconductor wafer 100 will be described with reference to FIG. 1 to FIG. 4. The laminated semiconductor wafer 100 is manufactured using a semiconductor wafer 1. The laminated semiconductor wafer 100 is a laminated semiconductor substrate according to a first embodiment of the present invention. In the laminated semiconductor wafer 100, a plurality of semiconductor wafers 1 are laminated. In the laminated semiconductor wafer 100 illustrated in FIG. 1, eight semiconductor wafers 1 are laminated. Since it is sufficient that a plurality of semiconductor substrates are laminated in the laminated semiconductor substrate according to the present invention, the number of the semiconductor wafers 1 which are laminated within the laminated semiconductor wafer 1 is not limited to eight.

Figure 1:
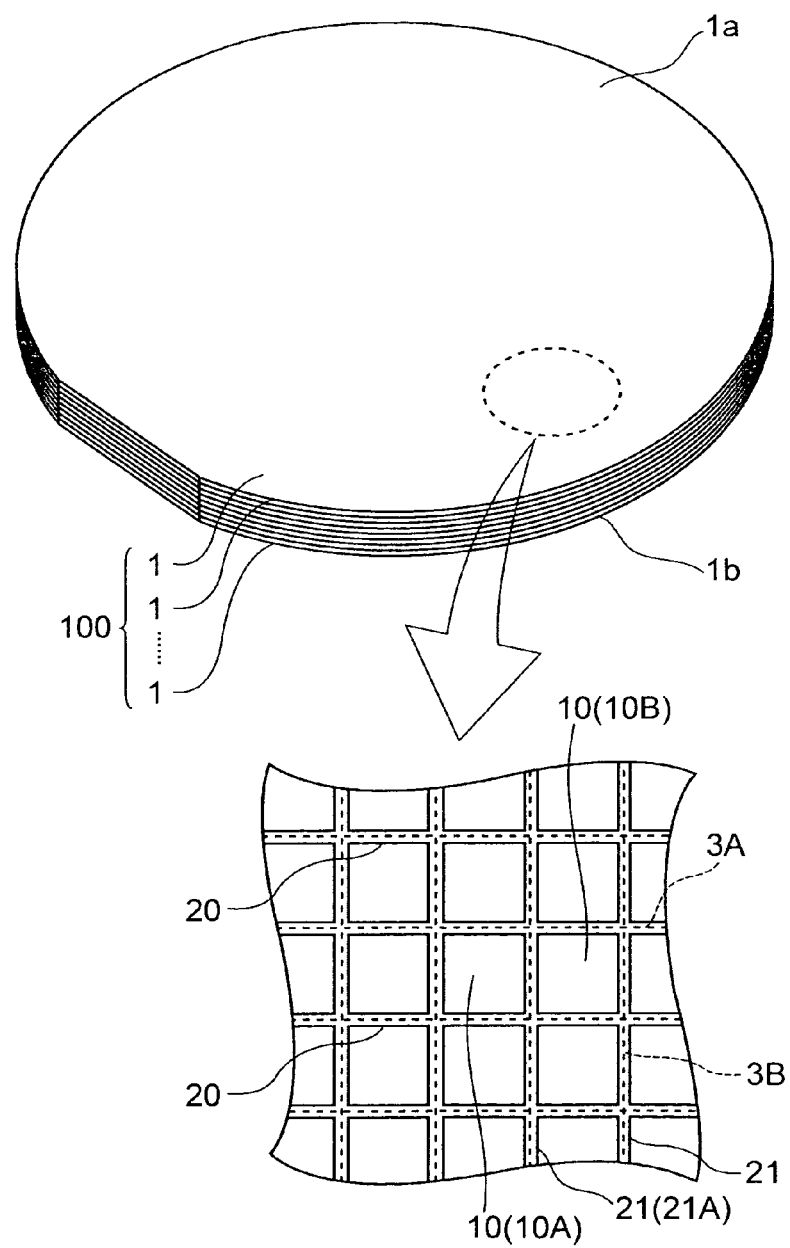
FIG. 1 is a perspective view illustrating the entire laminated semiconductor wafer according to a first embodiment of the present invention.
Figure 2:
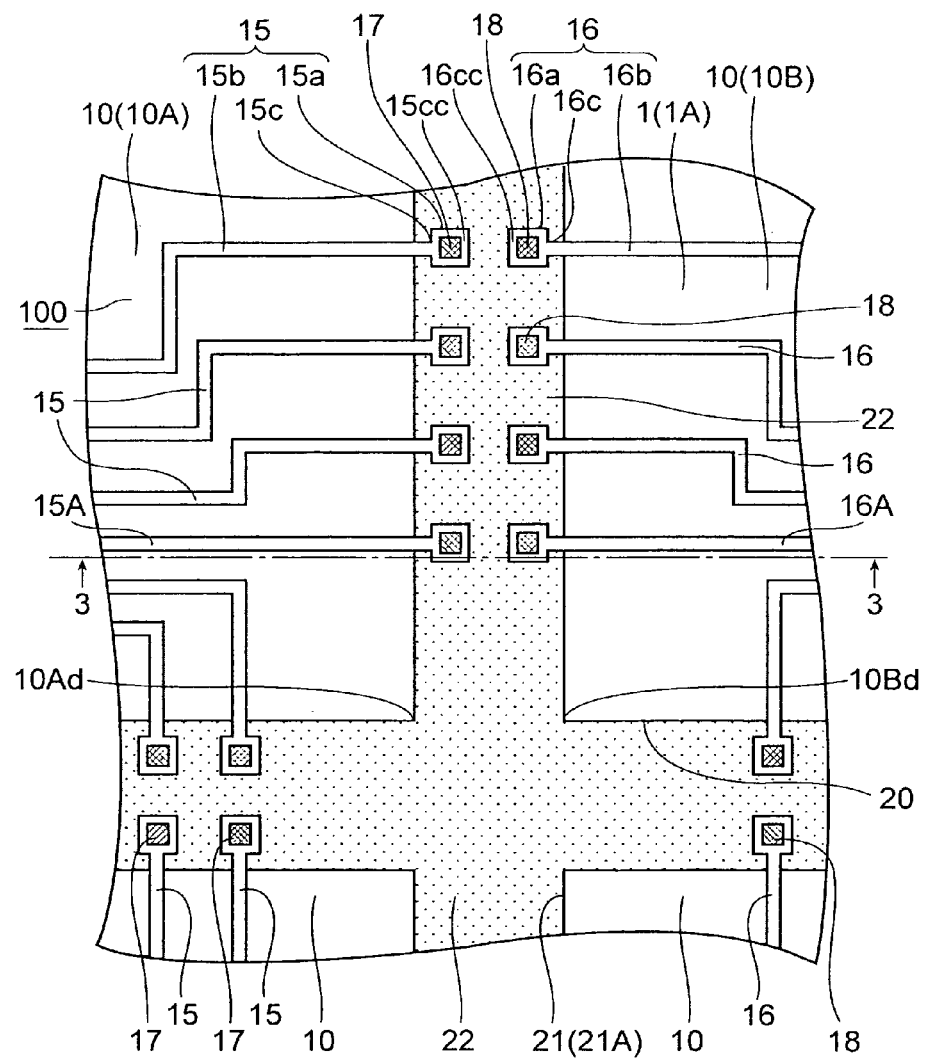
FIG. 2 is a plan view illustrating a principal part of two device regions of the laminated semiconductor wafer in FIG. 1.
Figure 3:
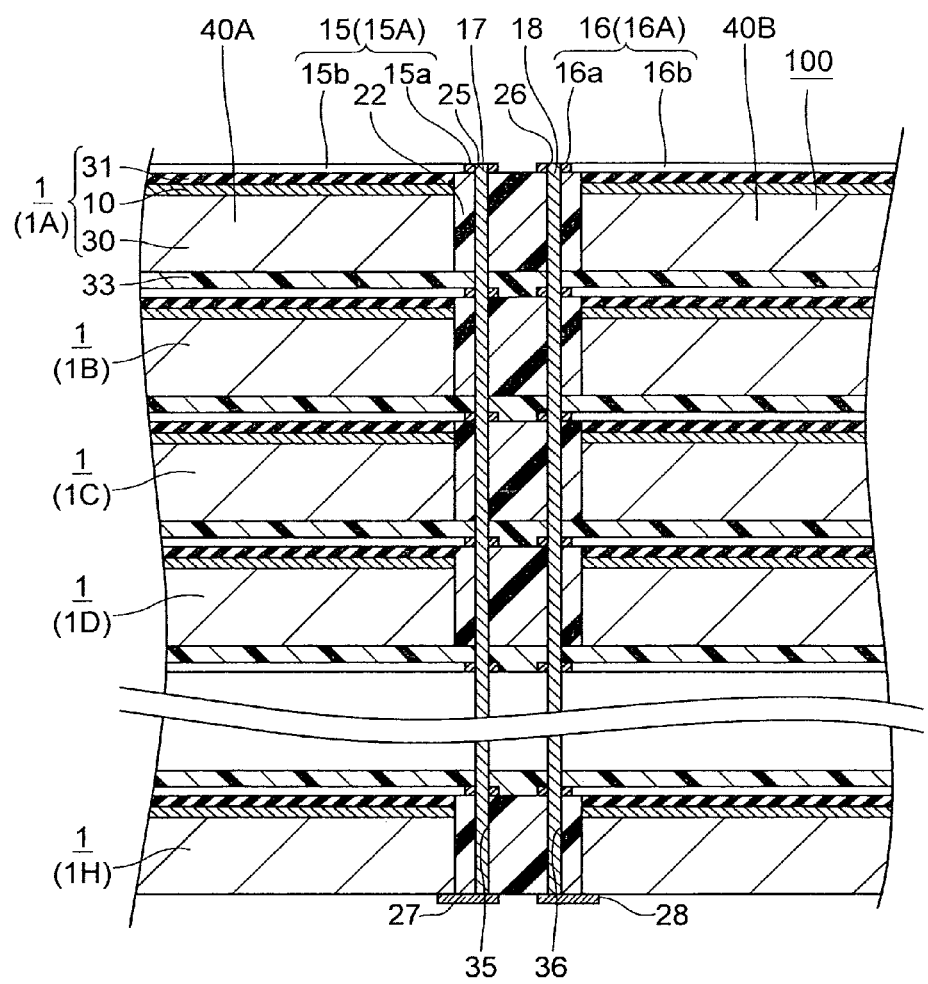
FIG. 3 is a sectional view taken along the line 3-3 in FIG. 2.
Figure 4:
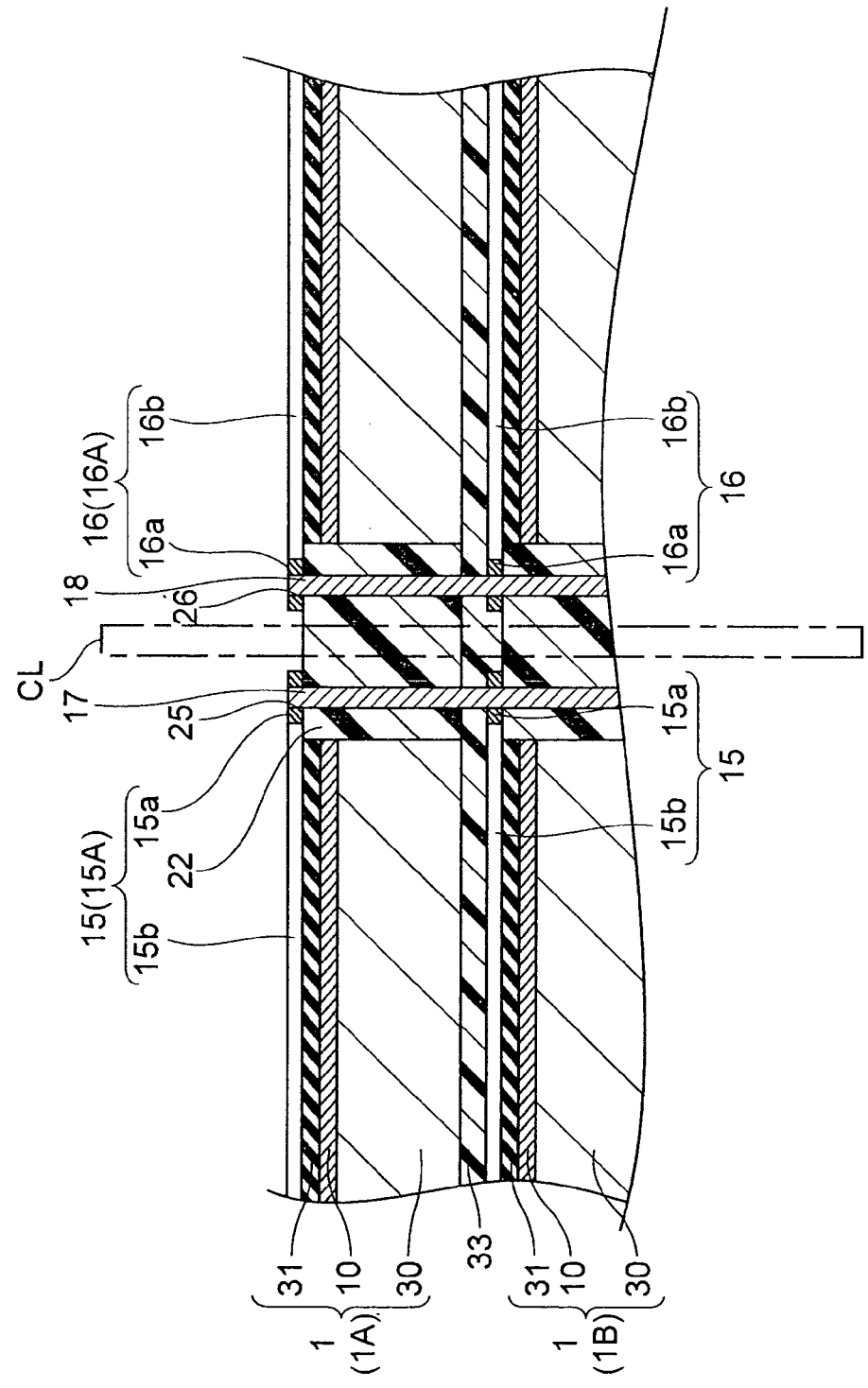
FIG. 4 is a sectional view illustrating a principal part of the laminated semiconductor wafer taken along the line 3-3 in FIG. 2.

Here, FIG. 1 is a perspective view illustrating the entire laminated semiconductor wafer 100. FIG. 2 is a plan view illustrating two device regions 10 of the laminated semiconductor wafer 100. Besides, FIG. 3 is a sectional view taken along the line 3-3 in FIG. 2, and FIG. 4 is a sectional view illustrating a principal part of the laminated semiconductor wafer 100 taken along the line 3-3 in FIG. 2.

The semiconductor wafer 1 is composed using a silicon wafer. The semiconductor wafer 1 has, as illustrated in FIG. 1, scribe lines 3A and 3B formed on a first surface 1a of the silicon wafer (the rear surface side of the first surface 1a is a second surface 1b). A plurality of each of the scribe lines 3A and 3B are formed on the first surface 1a and formed on straight lines at predetermined intervals along certain directions, respectively. The scribe lines 3A are orthogonal to the scribe lines 3B.

The semiconductor wafer 1 further has groove parts 20 and 21 formed in the first surface 1a. The groove parts 20 and 21 are formed along the scribe lines 3A and 3B, respectively, and each of them has a depth of about 20 to 60 μm and a width of about 50 to 120 μm. The later-described device region 10 is formed within a rectangular region surrounded by the adjacent groove parts 20, 20 and groove parts 21, 21.

Since the groove parts 20, 21 are formed along the scribe lines 3A and 3B, the groove parts 20, 21 have a constitution as a scribe groove parts of the present invention. Further, the groove parts 20, 21 are formed as through groove parts which reach the second surface 1b from the first surface 1a. A later-described in-groove insulating layer 22 is formed closely the inside of the groove parts 20, 21.

A large number of device regions 10 are formed on the semiconductor wafers 1. In FIG. 1, FIG. 2, one of the plurality of groove parts 21 is set groove part 21A, and adjacent two device regions 10 across the groove part 21A are set device region 10A, 10B. The groove part 21A has a constitution as an interposed groove part of the present invention. Respective device region 10A, 10B have a constitution as a first device region, a second device region according to the present invention.

The semiconductor wafer 1 has a silicon substrate 30 composed of the silicon wafer, and the device regions 10 are formed in the upper parts of the silicon substrate 30, as illustrated in FIG. 3, FIG. 4. A plurality of connecting pads 32 are formed on the surface of the device region 10 as illustrated in later-described FIG. 13 and so on, and a part other than the connecting pads 32 is covered with the protecting insulating layer 31.

The protecting insulating layer 31 is formed to cover the device region 10. The protecting insulating layer 31 is made of silicon dioxide ($SiO_2$) or the like, and has connecting holes 31a formed at positions where the connecting pads 32 are to be formed. The connecting holes 31a are formed to expose the connecting pads 32 so as to connect the later-described wiring electrodes 15, 16 to the connecting pads 32. The connecting pads 32 are connected to the semiconductor device in the device region 10 (see FIG. 9 for details).

Each of the device regions 10 has the memory part formed on the first surface 1a by performing wafer process, and a plurality of wiring electrodes 15 and 16 are formed as illustrated in detail in FIG. 2. Each of the device regions 10 is in contact with both of the groove parts 20, 21. Note that the wafer process means a manufacturing process of forming a semiconductor element and an integrated circuit on the semiconductor wafer such as the silicon wafer or the like.

When the above-described one semiconductor wafer 1 is cut along the scribe lines 3A and 3B, a chip-shape semiconductor piece, surrounded by the in-groove insulating layer 22, mainly comprising the device region 10 and the silicon substrate 30 is obtained. In the semiconductor wafer 1, a part, surrounded by the in-groove insulating layer 22, mainly comprising the device region 10 and the silicon substrate 30 is referred also to as a chip-planned area.

In addition to the memory part, an integrated circuit and a semiconductor element such as a CPU, a sensor, a drive circuit for the sensor may be formed as the semiconductor devices within the device region 10. Further, a memory part and an integrated circuit constituting a controller for controlling the memory part may be formed in the device region 10.

Next, the in-groove insulating layer 22 will be described. The in-groove insulating layer 22 is formed inside of the groove parts 20, 21. In FIG. 2, a surface of the in-groove insulating layer 22 is illustrated in a part with dot.

The in-groove insulating layer 22 is formed using an insulating resin such as an epoxy resin or a polyimide resin, or an insulating material made of silicon silicate glass (SOG) or the like closely filled the inside of the groove parts 20, 21. In this embodiment, a case using a resin for material of the in-groove insulating layer 22 is discussed.

It is especially preferable to form the in-groove insulating layer 22 using a resin having a low thermal expansion coefficient. This ensures that when the semiconductor wafer 1 is cut along the groove parts 20 and 21 by a dicing saw, the cutting can be easily performed.

Besides, since the in-groove insulating layer 22 is formed closely the inside of the groove parts 20, 21, an entire circumference of the respective device regions 10 are surrounded by the in-groove insulating layer 22. The in-groove insulating layer 22 is formed of insulating material. By this in-groove insulating layer 22, adjacent device regions 10 are electrically insulated.

Figure 20:
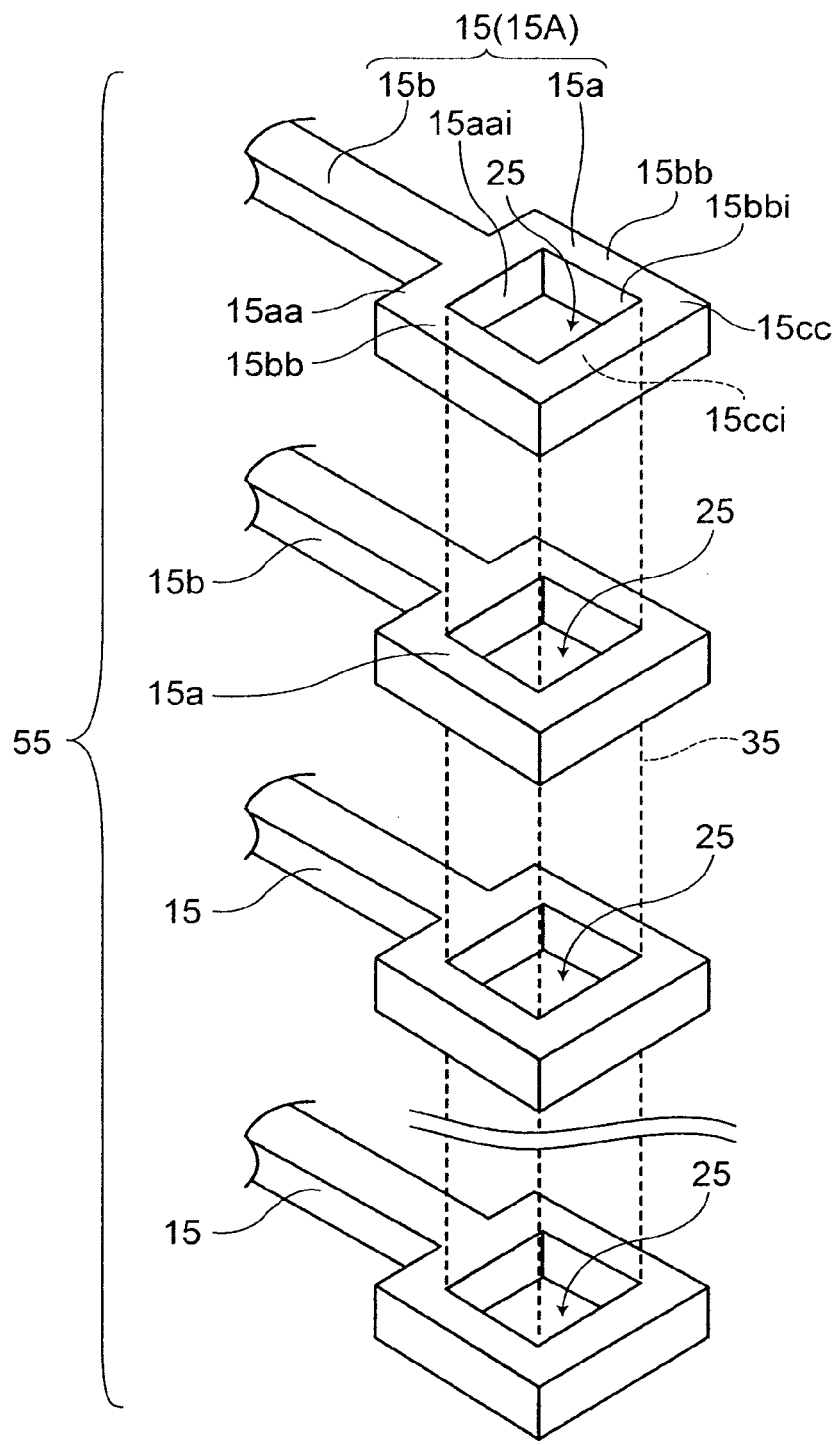
FIG. 20 is a perspective view illustrating a principal part of wiring electrodes stacked with along a laminated direction of the semiconductor wafer among a large number of wiring electrodes formed in the laminated semiconductor wafer in FIG. 1.
Figure 21:
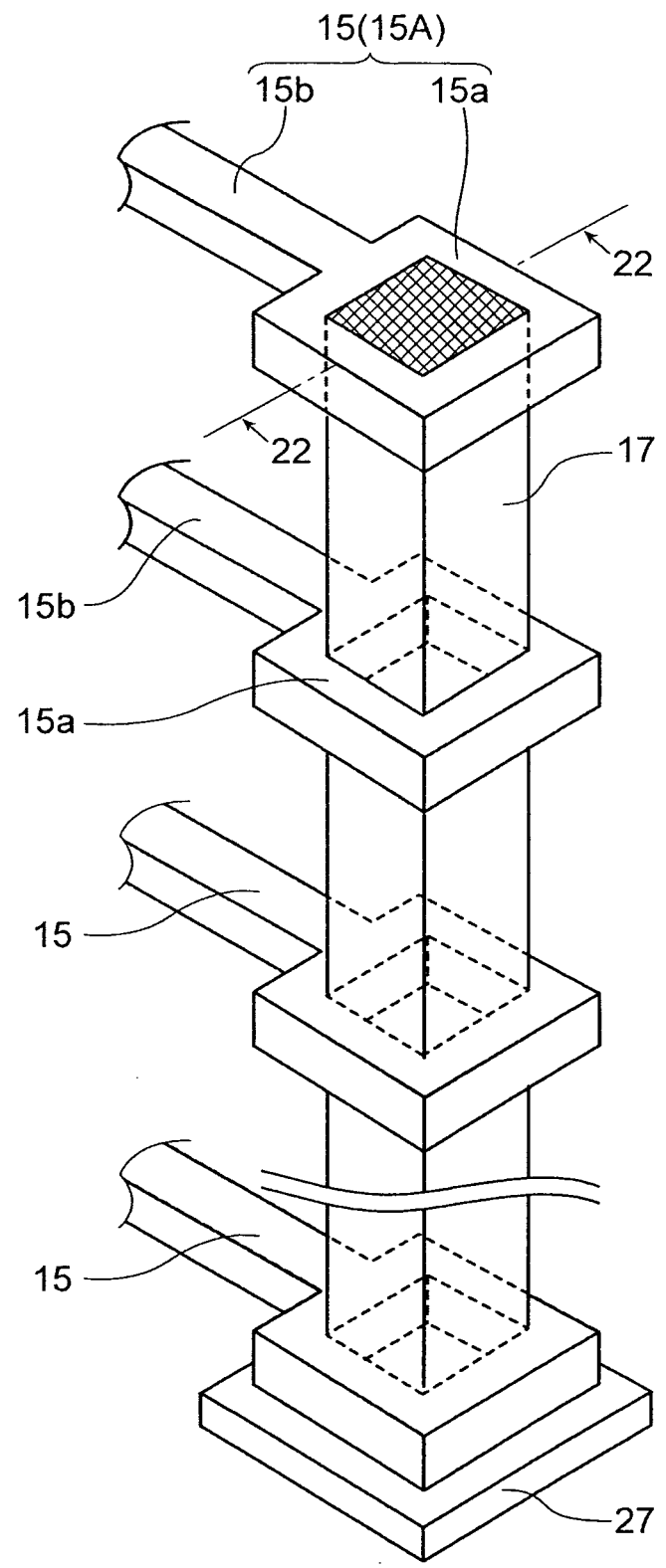
FIG. 21 is a perspective view illustrating a principal part of wiring electrodes, stacked with along a laminated direction of the semiconductor wafer among a large number of wiring electrodes formed in the laminated semiconductor wafer in FIG. 1, and a through electrode.
Figure 22:
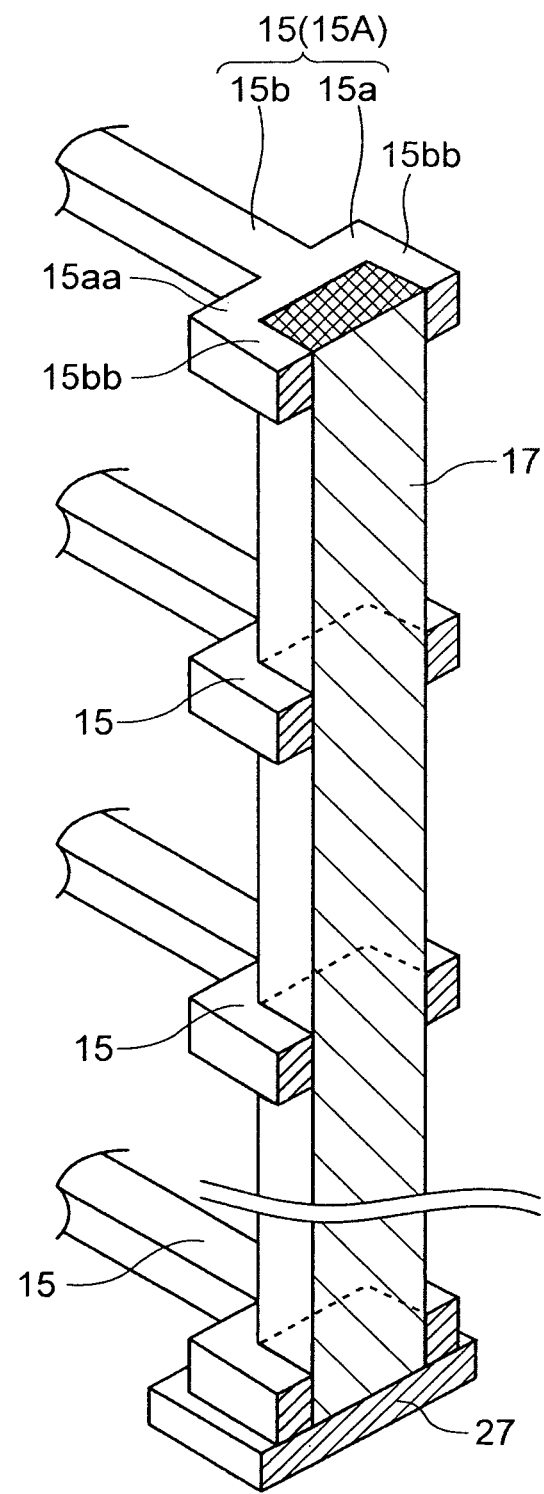
FIG. 22 is a sectional view taken along the line 22-22 in FIG. 21.

Next, wiring electrodes 15, 16 will be described with reference to FIG. 20 to FIG. 22 in addition to FIG. 2 to FIG. 4. Here, FIG. 20 is a perspective view illustrating a principal part of eight wiring electrodes 15 stacked with along a laminated direction of the semiconductor wafer 1 (hereinafter referred to as a "laminated direction") among a large number of wiring electrodes 15 formed in the laminated semiconductor wafer 100. FIG. 21 is a perspective view illustrating the eight wiring electrodes 15 and a through electrode 17. FIG. 22 is a sectional view taken along the line 22-22 in FIG. 21.

A plurality of each of the wiring electrodes 15, 16 are formed along the peripheries of the devices regions 10A, 10B, respectively as illustrated in FIG. 2. Further, parts of the wiring electrodes 15, 16 are formed extending from the devices regions 10A, 10B into the inside of the groove part 21A. Other parts of the electrodes 15 are formed extending to the inside of the groove part 20. The wiring electrodes 15, 16 are formed such that they are not in contact with each other but separated with a predetermined space therebetween. Further, the wiring electrodes 15, 16 are electrically insulated from each other. The wiring electrodes 15, 16 have a constitution as a first wiring electrode and a second wiring electrode, respectively. Note that though four wiring electrodes 15 and four wiring electrodes 16 extending to the inside of the groove part 21A are illustrated in FIG. 2, illustration of other wiring electrodes 15, 16 extending to the inside of the grove part 21A is omitted. FIG. 3 illustrates the section of the laminated semiconductor wafer 100 passing through a pair of wiring electrodes 15A, 16A among the plurality of the wiring electrodes 15, 16 extending to the inside of the groove part 21A.

Both of the wiring electrodes 15, 16 are made of a conductive material such as Cu, Au or the like. The wiring electrodes 15, 16 have electrode pads 15a, 16a and line-shape terminal parts 15b, 16b, respectively. Further, parts of the line-shape terminal parts 15b, 16b extending to the innermost of the groove part 21A are tip parts 15c, 16c, respectively, and the electrode pads 15a, 16a are connected to the respective tip parts 15c, 16c.

The electrode pads 15a, 16a are in rectangular shapes having substantially the same size. Further, the electrode pads 15a, 16a are formed such that the widths thereof along the length direction (the top-to-down direction in FIG. 2) of the groove part 21A are larger than those of the line-shape terminal parts 15b, 16b. The front side surfaces of both of the electrode pads 15a, 16a are flat. The side surfaces of both of the electrode pads 15a, 16a are also flat.

The electrode pads 15a, 16a are opposed to each other with a middle part in the width direction of the groove part 21A (the scribe line 3B) intervening therebetween. For example, the wiring electrodes 15A, 16A are formed such that the distances from corner parts 10Ad, 10Bd of the device regions 10A, 10B are identical to prevent displacement of the wiring electrodes 15A, 16A along the length direction of the groove part 21A.

The electrode pads 15a, 16a have later-described extended terminal parts 15cc, 16cc, respectively. Parts of the extended terminal parts 15cc, 16cc extending to the innermost of the groove part 21A are opposed to each other with the scribe line 3B intervening therebetween. More specifically, regarding to the extended terminal part 15cc, a side surface part on the outer side of the extended terminal part 15cc illustrated in FIG. 20 is a part extending to the innermost of the groove part 21A, and this part is opposed to the extended terminal part 16cc. The side surface part on the outer side of the extended terminal part 15cc has a constitution as an endmost part in the present invention.

Beside, the electrode pad 15a has a hole part 25 formed at the center thereof as illustrated in detail in FIG. 20. The hole part 25 penetrates from the front side to the rear side of the electrode pad 15a along the width direction of the semiconductor wafer 1, namely, the laminated direction. The electrode pad 15a has a base part 15aa and two crossing parts 15bb in addition to the extended terminal part 15cc. The base part 15aa, the two crossing parts 15bb, and the extended terminal part 15cc surround the periphery of the hole part 25. Therefore, the electrode pad 15a is formed in a rectangular ring shape. Note that the electrode pad 16a also has a hole part 26 similar to the hole part 25 and is also formed in a rectangular ring shape as illustrated in FIG. 3.

The base part 15aa is a part that is connected to the line-shape terminal part 15b and wider than the line-shape terminal part 15b. The two crossing parts 15bb are parts that are connected to the base part 15aa and extend in a direction crossing the base part 15aa from the base part 15aa. The extended terminal part 15cc is a part that is connected to the two crossing parts 15bb and extends farthest in the electrode pad 15a. Besides, inner side surfaces of the base part 15aa, the two crossing parts 15bb and the extended terminal part 15cc facing the hole part 25 are an inner surface 15aai, two inner surfaces 15bbi, and an inner surface 15cci, respectively. All parts of these inner surfaces appear in a later-described through hole 35 and are in direct contact with a later-described through electrode 17 as illustrated in FIG. 21, FIG. 22.

The line-shape terminal parts 15b, 16b are line-shape parts leading from the electrode pads 15a, 16a to the connecting pads 32, respectively.

The laminated semiconductor wafer 100 has a structure such that the above-described semiconductor wafers 1 are bonded together with an insulating adhesive to be laminated one on the other. In the laminated semiconductor wafer 100, as illustrated in FIG. 3, eight identical semiconductor wafers 1A, 1B, 1C, 1D . . . and 1H are laminated. Incidentally, illustration of the semiconductor wafers 1E to 1G is omitted in FIG. 3.

The laminated semiconductor wafer 100 has laminated chip regions 40A, 40B. The laminated chip regions 40A, 40B include respective eight device regions 10A, 10B laminated in the laminated direction in the semiconductor wafers 1A to 1H. The laminated chip regions 40A, 40B are regions that are insulated from each other by the in-groove insulating layers 22 and later-described adhesive layers 33 and will be later-described discrete laminated chip packages 200, respectively. When the laminated semiconductor wafer 100 is cut along the groove parts 20, 21, the laminated chip regions 40A, 40B are separated to form a plurality of laminated chip packages 200 (described later in detail).

Further, in the laminated semiconductor wafer 100, through holes 35, 36 are formed as illustrated in detail in FIG. 3. The through holes 35, 36 are formed for the respective electrode pads 15a, 16a. Therefore, a plurality of each of through holes 35, 36 are formed in the laminated semiconductor wafer 100. One through electrode 17, 18 is formed inside each through hole 35, 36, respectively. Further, electrode pads 27, 28 are formed on the semiconductor wafer 1H side of the laminated semiconductor wafer 100. The electrode pads 27, 28 are connected to the through electrodes 17, 18, respectively.

Each of the semiconductor wafers 1A to 1H has the identical device regions 10A, 10B, in-groove insulating layer 22, wiring electrodes 15, 16 and so on. When the laminated semiconductor wafer 100 is seen in the laminated direction, eight electrode pads 15a, 16a are arranged along the respective through holes 35, 36. The illustration of the relation between the through hole 35 and the electrode pads 15a is, for example, as illustrated in FIG. 20.

Further, the wiring electrodes 15, 16 of the respective eight electrode pads 15a, 16a along the through holes 35, 36 have common positions in the semiconductor wafers 1A to 1H. For example, all of the wiring electrodes 15A in the respective semiconductor wafers 1A, 1B, 1C, 1D, . . . , and 1H are formed in the device regions 10A and formed at positions having the identical positional relation with the corner parts 10Ad. These electrode pads 15a are arranged in a straight line along the through hole 35.

Here, it is assumed that the wiring electrodes 15, 16 having common positions among the wiring electrodes 15, 16 in the respective semiconductor wafers 1A to 1H are common wiring electrodes. In the laminated semiconductor wafer 100, the common wiring electrodes are arranged in a straight line along the laminated direction. For example, the eight wiring electrodes 15A in total in the respective semiconductor wafers 1A, 1B, 1C, 1D, . . . , and 1H are the common wiring electrodes. The wiring electrodes 15A being identical wiring electrodes 15 constitute a laminated electrode group 55 illustrated in FIG. 20. The laminated electrode group 55 is composed of a plurality of wiring electrodes 15 and wiring electrodes 16 laminated in the laminated direction.

The through hole 35 is formed in a straight line connecting, along the laminated direction, all of the hole parts 25 formed in the respective electrode pads 15a of the eight wiring electrodes 15 constituting the laminated electrode group 55. Further, the through hole 35 penetrates the groove parts 21A, the in-groove insulating layers 22, and the adhesive layers 33 of the semiconductor wafers 1A to 1H as illustrated in FIG. 3. This is resulted from that the electrode pads 15a extend to the insides of the groove parts 21A, the in-groove insulating layers 22 are formed inside the groove parts 21A, and the adhesive layers 33 are formed between the semiconductor wafers 1A to 1H.

The through hole 36 is formed in a straight line connecting, along the laminated direction, all of the hole parts 26 formed in the respective electrode pads 16a of the eight wiring electrodes 16 constituting the laminated electrode group. The through hole 36 also penetrates the groove parts 21A, the in-groove insulating layers 22, and the adhesive layers 33 like the through hole 35.

The whole inner surfaces, facing the hole parts 25, 26, of the eight electrode pads 15a, 16a constituting the respective laminated electrode groups 55 appear in the through holes 35, 36. In other words, regarding the through hole 35, all of the whole parts of the inner surface 15aai, two inner surfaces 15bbi, and inner surface 15cci of the electrode pads 15a appear in the through hole 35 as illustrated in FIG. 20. Further, the through electrodes 17, 18 are formed inside the above-described through holes 35, 36. Therefore, the whole inner surfaces, facing the hole parts 25, of all of the eight electrode pads 15a constituting the laminated electrode group 55 are individually in direct contact with the peripheral surface of the through electrode 17 as illustrated in FIG. 21, FIG. 22. Note that though the through hole 36, the electrode pads 16a and the through electrode 18 are not illustrated in FIG. 21, FIG. 22, they are identical to the through hole 35, the electrode pads 15a and the through electrode 17.

The through electrodes 17, 18 penetrate all of the semiconductor wafers 1A to 1H passing through the inside of the through holes 35, 36, respectively. Further, the through electrode 17, 18 is formed in a straight one-bar shape. The through electrode 17, 18 is a one conductor without joint. Rectangular parts with mesh in FIG. 2 indicate the front surfaces of the through electrodes 17, 18. Both of the through electrodes 17, 18 are made of a metal member such as Cu, Au or the like. The through electrodes 17, 18 are in direct contact with the eight electrode pads 15a, 16a appearing in the through holes 35, 36, respectively. Since the whole inner surfaces of the respective eight electrode pads 15a, 16a appear in the through holes 35, 36 as describe above, the through electrodes 17, 18 are in contact with the whole inner surfaces of the eight electrode pads 15a, 16a, respectively.

Figure 9:
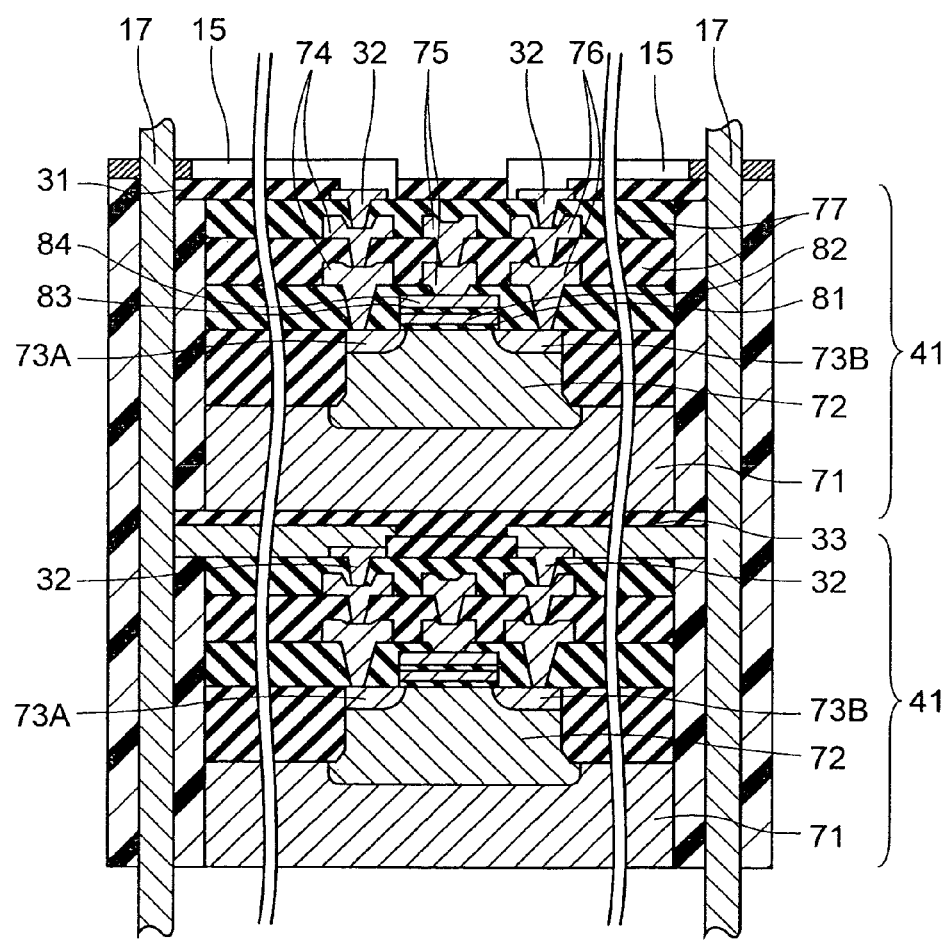
FIG. 9 is a sectional view mainly illustrating memory cells of a laminated semiconductor wafer in FIG. 1.

Meanwhile in the memory part of the device region 10, a number of memory cells 41 as the semiconductor devices are formed. The memory cell 41 has a structure as illustrated in FIG. 9. FIG. 9 is a sectional view mainly illustrating memory cells 41 of a laminated semiconductor wafer 100.

To the memory cell 41, the wiring electrodes 15 and 16 are connected via the connecting pads 32. The memory cell 41 is formed on the surface of an N-type substrate 71 constituting the semiconductor wafer 1. In FIG. 9, two memory cells 41 are laminated one on the other via an adhesive layer 33. The adhesive layer 33 is formed by an adhesive used when the semiconductor wafers 1 are bonded together.

Each of the memory cells 41 constitutes a flash memory and is formed on a P-type well 72 which is formed on the surface of the N-type substrate 71. The memory cell 41 has a source 73A and a drain 73B, insulating layers 77, an insulating film 81, a floating gate 82, an insulating film 83 and a control gate 84. The memory cell 41 further has a source electrode 74, a drain electrode 76 and a gate electrode 75.

Both of the source 73A and the drain 73B are N-type regions and connected with the source electrode 74 and the drain electrode 76, respectively. The insulating layers 77 are formed with contact holes for connecting the connecting pads 32 to the source electrode 74 and the drain electrode 76, respectively. The source electrode 74, the gate electrode 75, and the drain electrode 76 are connected to the source 73A, the control gate 84 and the drain 73B via the corresponding contact holes, respectively.

(Operation and Effect of Laminated Semiconductor Wafer 100)

As described above, in the laminated semiconductor wafer 100, the wiring electrodes 15, 16 are formed in the two device regions 10A, 10B adjacent to each other with the groove part 21A intervening therebetween. The wiring electrodes 15, 16 extend from the device regions 10A, 10B to the inside of the groove part 21A, and are arranged such that they are not in contact with each other but separated with a predetermined space therebetween. Further, the whole peripheries of the device regions 10A, 10B are surrounded by the in-groove insulating layer 22 and thus insulated from each other. Further, the laminated chip regions 40A, 40B are formed of the eight device regions 10A, 10B laminated in the laminated direction. In the laminated chip regions 40A, 40B, the eight device regions 10 included therein respectively are connected by the wiring electrodes 15, 16 and the through electrodes 17, 18.

Since the laminated semiconductor wafer 100 has the above-described structure, a package inspection is able to be performed for the individual laminated chip package in a state of the wafer structure in which the plurality of semiconductor wafers 1 are laminated, without cutting and physically separating the laminated chip regions 40A, 40B.

In other words, the package inspection only for the laminated chip region 40A is able to be performed by bringing a probe into contact with the electrode pads 15. Further, the package inspection only for the laminated chip region 40B is able to be performed by bringing a probe into contact with the electrode pads 16. The laminate chip regions 40A, 40B are regions that will be discrete laminated chip packages 200 respectively, and the package inspection is able to be performed for each of the laminate chip regions 40A, 40B, even in the laminated semiconductor wafer 100. Therefore, in the laminated semiconductor wafer 100, the package inspection for the whole individual laminated chip package is able to be performed in a state of the wafer structure.

Accordingly, the laminated semiconductor wafer 100 has a structure in which the package inspection is easily performed for the whole individual laminated chip packages. The laminated semiconductor wafer 100 is able to be subjected to the package inspection even at a stage of the wafer test before the laminated chip packages are completed. Therefore, the use of the laminated semiconductor wafer 100 enables enhancement of the efficiency of the whole inspection process required for manufacture of the laminated chip packages, resulting in a reduced manufacturing time. Consequently, the laminated semiconductor wafer 100 has a structure with which the number of laminated chip packages manufacturable per unit time can be increased by reducing the manufacturing time.

Further, the laminated chip regions 40A, 40B include sets of wirings for constituting the laminated chip packages 200, such as the wiring electrodes 15, 16, the through electrodes 17, 18 and so on. Therefore, the package inspection reflecting the contact resistance which can occur at connection parts between the wirings can be performed for the laminated semiconductor wafer 100.

Furthermore, the through holes 35, 36 are formed in the laminated semiconductor wafer 100. The through hole 35 is formed in a straight line connecting all of the hole parts 25 of the wiring electrodes 15 constituting the laminated electrode group 55 and is thus very easy to form. The through hole 36 is also easy to form. Since the through hole 35, 36 is formed in a straight line, the through electrode 17, 18 is a conductor in a one-bar shape and is thus easy to form. Further, the through electrode 17, 18 is a one conductor in a bar shape without joint passing through the respective through hole 35, 36, and thus has a structure in which the contact resistance caused by the contact between conductors for connecting the semiconductor wafers does not occur.

All of the wiring electrodes 15 constituting the laminated electrode group 55 (the inner surfaces of the electrode pads 15a in particular) appear in the through hole 35. Therefore, by filling the inside of the whole through hole 35 with metal such as Cu, Au or the like, the through electrode 17 can be obtained in the form connected to all of the wiring electrodes 15 constituting the laminated electrode group 55. This also applies to the through hole 36 and the through electrode 18. Accordingly, in manufacturing the laminated semiconductor wafer 100, the through electrodes 17, 18 can be easily connected to all of the eight wiring electrodes 15, 16 constituting the laminated electrode groups 55.

The through electrode 17, 18 is completed only by forming one conductor passing through the through hole 35, 36 even though the eight semiconductor wafers 1A to 1H are laminated. Therefore, it is unnecessary to repeat the process of forming the through electrode for each individual semiconductor wafer. Therefore, in the laminated semiconductor wafer 100, the time required for forming the through electrodes can be reduced. Accordingly, the laminated semiconductor wafer 100 has a structure with which the number of laminated chip packages manufacturable per unit time can be further increased by further reducing the manufacturing time.

Further, the through electrode 17, 18 is a one conductor in a bar shape without joint and thus has a contact resistance lower than the contact resistance in the case where the device regions 10 are connected by the through electrodes individually formed in the semiconductor wafers 100.

Meanwhile, the through holes 35, 36 penetrate the hole parts 25, 26 of the respective electrode pads 15a, 16a, the in-groove insulating layers 22, and the adhesive layers 33. Parts of the adhesive layers 33 enter the hole parts 25, 26. Therefore, the through holes 35, 36 can be completed by forming holes penetrating only the resin layers (described later for detail). It is unnecessary to form holes penetrating the silicon substrates 30 in order to form the through holes 35, 36. The resin layers are softer than the silicon substrates. Since the through holes 35, 36 are completed only by forming the holes penetrating the resin layers, the formation of the through holes 35, 36 are easily performed by laser beam machining or the like. It takes less labor to form the through holes 35, 36, and it is also possible to reduce the time required for forming the through holes 35, 36. Therefore, the laminated semiconductor wafer 100 has a structure with which the manufacturing time can be further reduced and the number of the laminated chip packages manufacturable per unit time can be further increased.

Besides, the inner surfaces of the electrode pad 15a facing the hole part 25 are four inner surfaces such as the inner surface 15aai, the two inner surfaces 15bbi, and the inner surface 15cci, and the peripheral surface of the through electrode 17 is in direct contact with whole part of all of them. Therefore, a large contact area between the electrode pad 15a and the through electrode 17 is secured. Further, since the electrode pad 15a is in contact with the peripheral surface, in all directions, of the through electrode 17, the current flows more smoothly than the case where the electrode pad 15a is in contact with the peripheral surface in a part of directions.

Furthermore, since the through hole 35 is formed along the hole part 25 of the electrode pad 15a, a hole part on an extension line when the hole part 25 is extended along the laminated direction can be set as the through hole 35. Since such a through hole 35 is easy to form, the time required for forming the through hole 35 can be further reduced.

Further, the electrode pads 15a, 16a of the wiring electrodes 15, 16 are opposed to each other in the laminated semiconductor wafer 100. Therefore, the wiring pattern for forming the wiring electrodes 15, 16 can be relatively easily formed. Further, the position adjustment when the probe is brought into contact with the electrode pads 15, 16 is also easily performed, so that the laminated semiconductor wafer 100 has a structure in which the package inspection is accordingly easily performed.

The through hole 35 (also the through hole 36) penetrates the eight wiring electrodes 15 constituting the laminated electrode group 55. The laminated electrode group 55 is composed of the common wiring electrodes. Therefore, the through hole 35 has a structure capable of connecting the eight electrode pads 15a in the semiconductor wafers 1A to 1H in a shortest distance. Therefore, it take less labor to form the through hole 35 and it is also possible to reduce the time required for forming the through hole 35. Further, the through electrode 17 is in a straight one-bar shape and thus connects the eight electrode pads 15a in a required minimum distance. Accordingly, the metal such as Cu, Au or the like required for forming of the through electrode 17 can also be saved.

Meanwhile, the above-described laminated electrode group 55 is composed of the wiring electrodes 15A being identical common wiring electrodes in all of the eight semiconductor wafers 1A to 1H. The laminated electrode group according to the present invention may be composed of a plurality of kinds of common wiring electrodes. For example, the common wiring electrodes may be different between the four semiconductor wafers 1A to 1D and the four semiconductor wafers 1E to 1H. For example, the wiring electrodes 15A may be used as the common wiring electrodes in the semiconductor wafers 1A to 1D and the wiring electrodes 15 adjacent to the wiring electrodes 15A may be used as the common wiring electrodes in the semiconductor wafers 1E to 1H so that the eight wiring electrodes 15 constitute the laminated electrode group. This constitution requires another electrode between the semiconductor wafer 1D and the semiconductor wafer 1E. Even in this constitution, it is possible to connect all of the eight semiconductor wafers 1A to 1H.

Further, in the above-described semiconductor wafer 100, the eight semiconductor wafers 1A to 1H are laminated. It is also adoptable to use the semiconductor wafer 100 as a unit laminated substrate and laminate a plurality of the unit laminated substrates to form a laminated semiconductor wafer. For example, in the laminated semiconductor wafer in which two unit laminated substrates are laminated, 16 semiconductor wafers are laminated. In three unit laminated substrates, 24 semiconductor wafers are laminated. Accordingly, the number of the semiconductor wafers which are laminated within the laminated semiconductor wafer is a multiple of 8.

Furthermore, it is also adoptable to use the laminated semiconductor wafer in which the four semiconductor wafers 1A to 1D are laminated as a unit laminated substrate, and laminate a plurality of the unit laminated substrates to form a laminated semiconductor wafer. In this case, the number of the semiconductor wafers which are laminated within the laminated semiconductor wafer is a multiple of 4.

When the laminated semiconductor wafer 100 is formed in the above-described unit structure, the number of units according to the capacity of a memory required in the laminated chip package can be easily found. Further, the capacity of the memory in the laminated chip package can be easily varied only by varying the lamination number of unit laminated substrates. For example, when one unit is formed to provide 64 GB, memories of 128 GB and 256 GB can be realized only by varying the lamination number of units. Note that since all multiples of 8 are multiples of 4, it is preferable to laminate the four semiconductor wafers 1A to 1D to form the unit laminated substrate.

(Method of Manufacturing Laminated Semiconductor Wafer 100)

Figure 10:
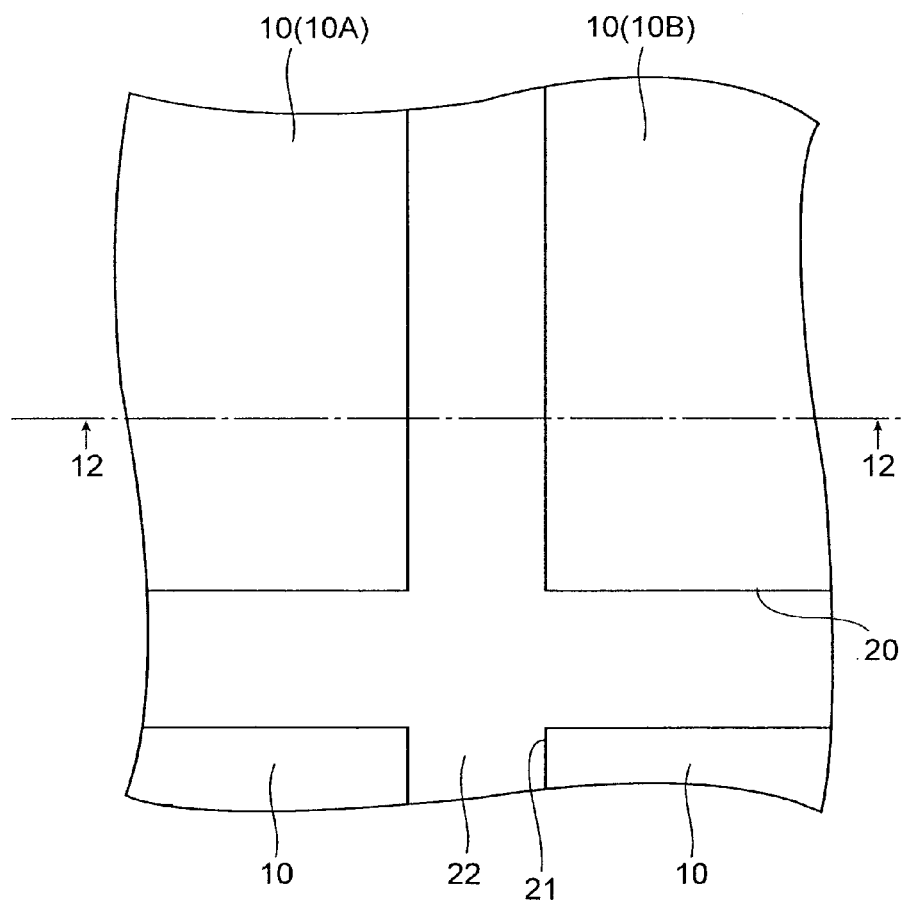
FIG. 10 is a plan view similar to FIG. 2, illustrating the partially manufactured laminated semiconductor wafer.
Figure 11:
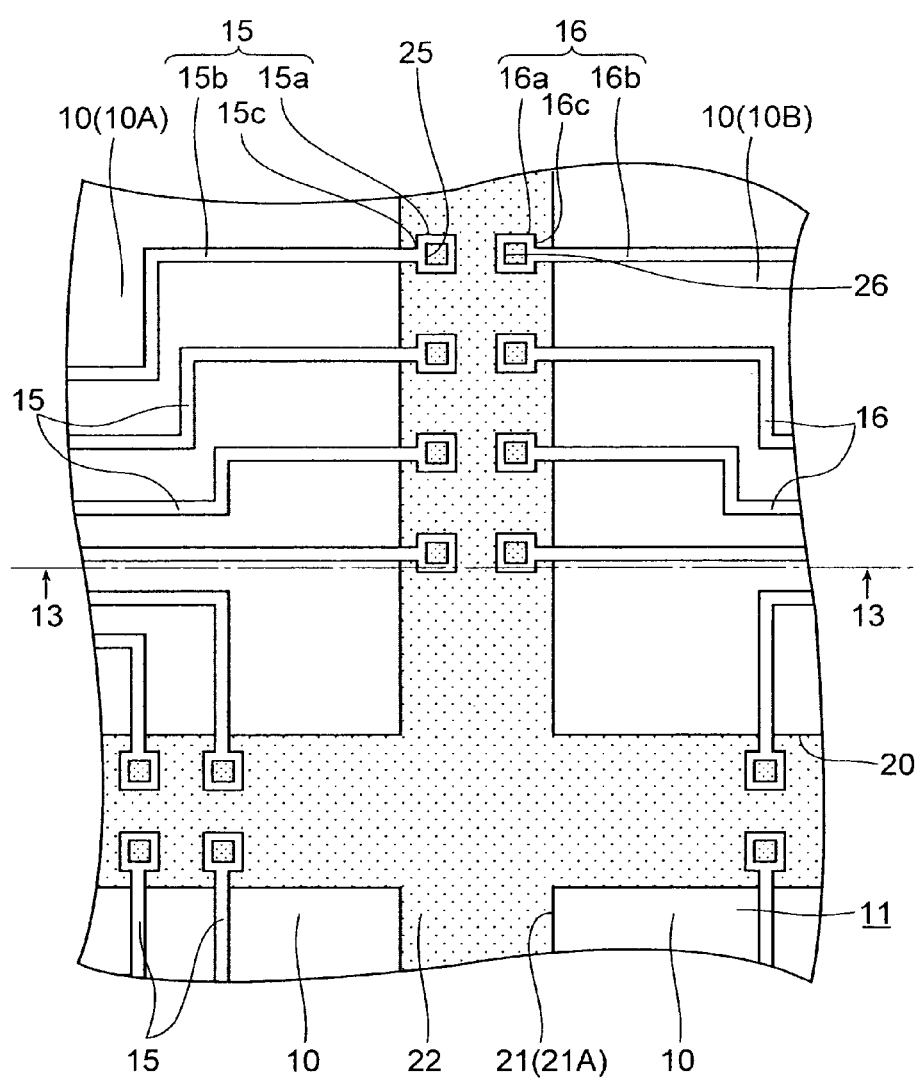
FIG. 11 is a plan view similar to FIG. 2, illustrating the laminated semiconductor wafer subsequent to that in FIG. 10.
Figure 12:
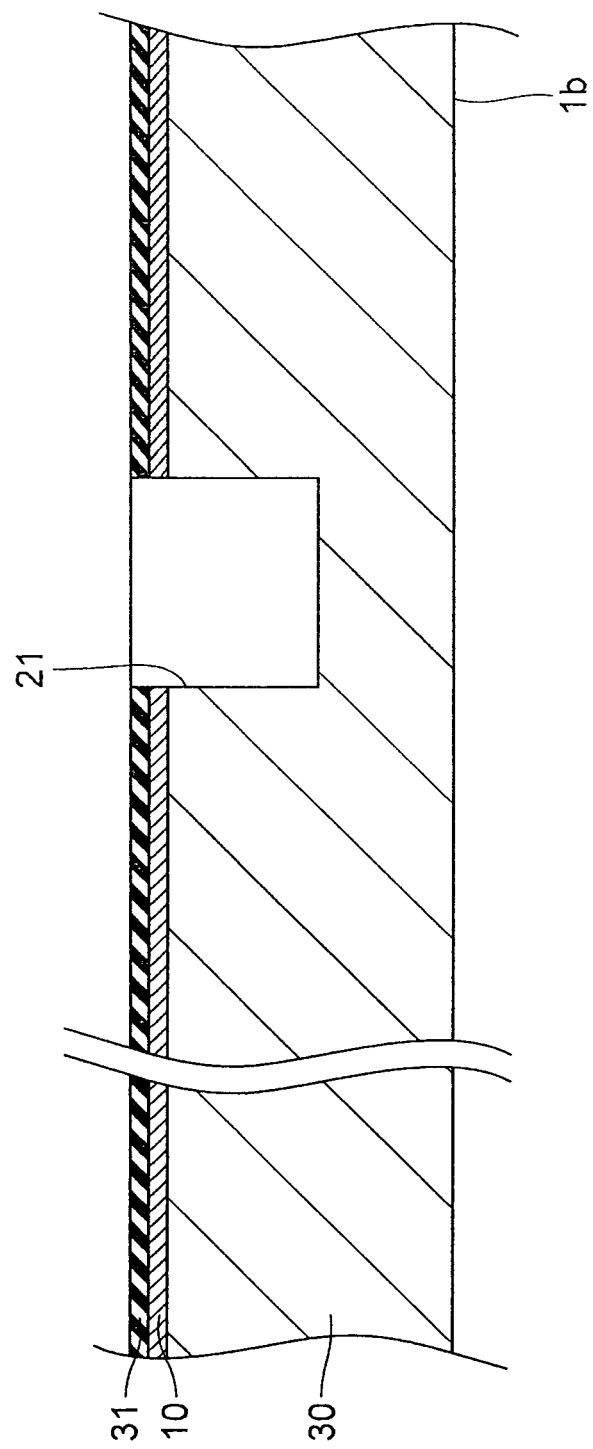
FIG. 12 is a sectional view taken along the line 12-12 in FIG. 10.
Figure 13:
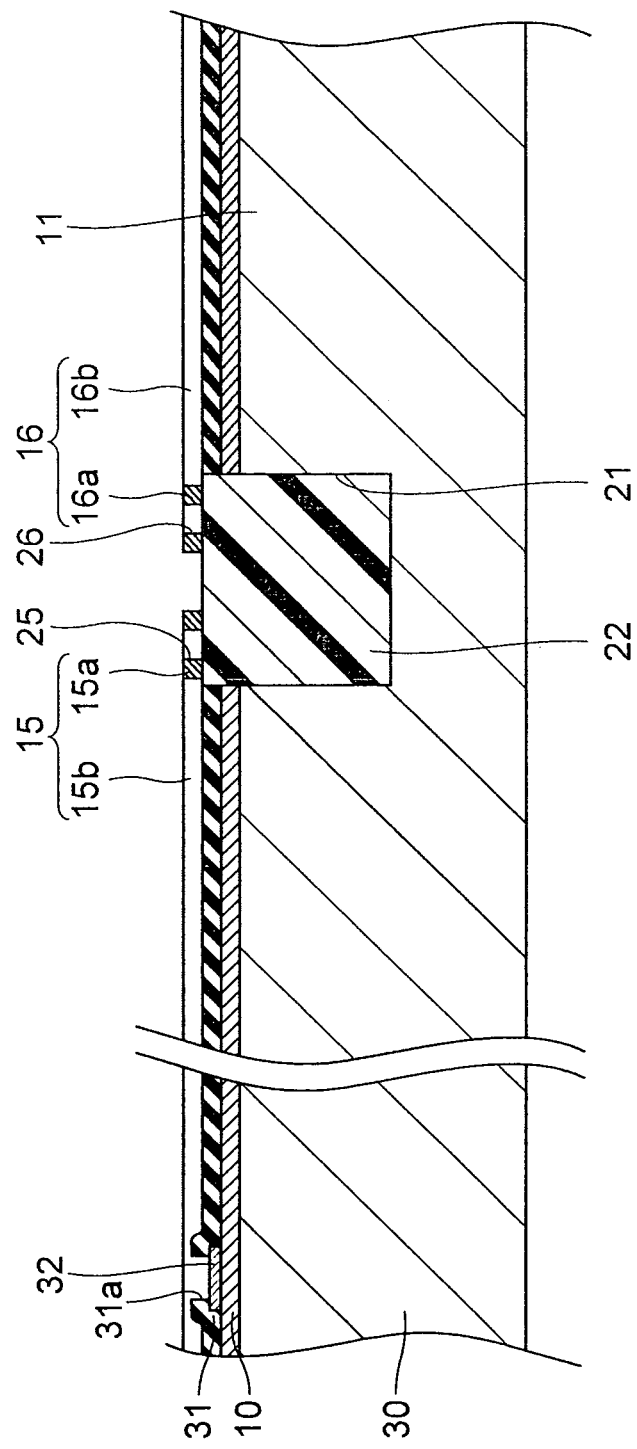
FIG. 13 is a sectional view taken along the line 13-13 in FIG. 11.
Figure 14:
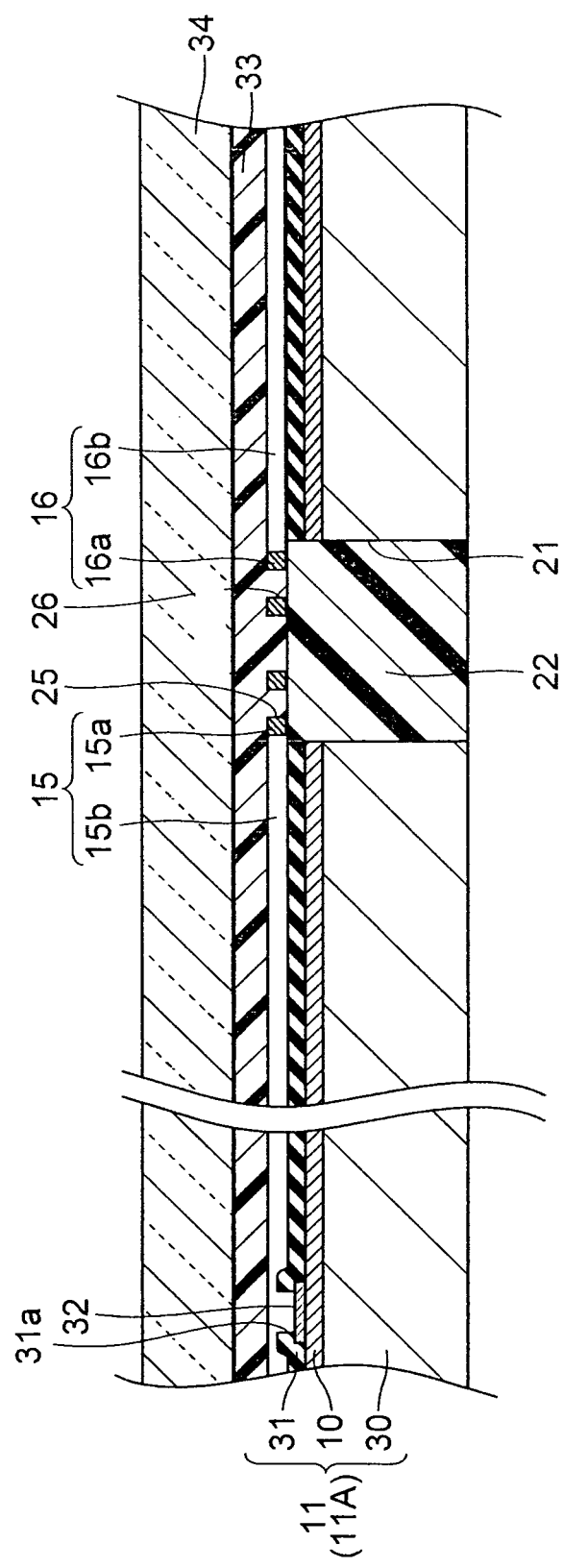
FIG. 14 is a sectional view similar to FIG. 12, illustrating the laminated semiconductor wafer subsequent to that in FIG. 13.

Subsequently, the method of manufacturing the laminated semiconductor wafer 100 having the above-described structure will be described with reference to FIG. 10 to FIG. 19 in addition to FIG. 1 to FIG. 4, FIG. 20 to FIG. 22. Here, FIG. 10 is a plan view similar to FIG. 2, illustrating the partially manufactured laminated semiconductor wafer. FIG. 11 is a plan view similar to FIG. 2, illustrating the laminated semiconductor wafer subsequent to that in FIG. 10. FIG. 12 is a sectional view taken along the line 12-12 in FIG. 10. FIG. 13 is a sectional view taken along the line 13-13 in FIG. 11. Further, FIG. 14 is a sectional view similar to FIG. 12, illustrating the laminated semiconductor wafer subsequent to that in FIG. 13. FIG. 15 to FIG. 19 are sectional views similar to FIG. 12, respectively illustrating the laminated semiconductor wafers subsequent to that in the order.

For manufacturing the laminated semiconductor wafer 100, to begin with, a device region forming process is performed. In the device region forming process, a wafer (unprocessed wafer) is prepared which has memory parts and a plurality of connecting pads 32 formed in the device regions 10 by performing wafer process. Then, the protecting insulating layer 31 is formed on the first surface 1a for the unprocessed wafer, as illustrated in FIG. 12.

Then, the plurality of groove parts 20 and 21 are formed along the scribe lines 3A and 3B. In FIG. 10, the groove part 20 and 21 are illustrated one by one, but the plurality of groove parts 20 and 21 are formed respectively. The groove parts 20 and 21 are able to be formed by the dicing saw, and may be formed by etching such as the reactive ion etching or the like. By forming of the plurality of groove parts 20 and 21 respectively, the plurality of device regions 10 are formed in the unprocessed wafer.

Subsequently, insulating layer forming process is performed. In the insulating layer forming process, an insulating resin, for example, such as an epoxy resin, a polyimide resin or the like is applied to the entire first surface 1a of unprocessed wafer. Then, the applied resin spreads over the entire surface of the unprocessed wafer and further flows into the groove parts 20 and 21. Subsequently, the surface of the unprocessed wafer is polished to be planarized. Thus, the in-groove insulating layer 22 is formed inside the groove parts 20, 21, as illustrated in FIG. 11, 13. A part flowed into the inside of the groove parts 20, 21 in the applied resin become to the in-groove insulating layer 22.

Next, as illustrated in FIG. 13, the contact holes 31a are formed in the insulating layer 31 to expose the connecting pads 32.

After that, substrate forming process is performed. In this substrate forming process, a substrate with electrode 11 is formed by forming a plurality of wiring electrodes 15 or a plurality of wiring electrodes 16 in the respective device regions 10. In this case, the wiring electrode 15 and the wiring electrode 16 are formed to extend from the device regions 10A, 10B adjacent to each other with the groove part 21 (the interposed groove part 21A) intervening therebetween to the inside of the groove part 21 and not to be in contact with each other but separate from each other. Further, the wiring electrode 15 and the wiring electrode 16 are formed in shapes having the electrode pads 15a, 16a formed with the hole parts 25, 26, respectively. Further, the electrode pads 15a, 16a are opposed to each other with the middle part in the width direction of the groove part 21A intervening therebetween. Since the hole parts 25, 26 penetrate the electrode pads 15a, 16a, the surface of the in-groove insulating layer 22 is exposed inside the hole parts 25, 26 as illustrated in FIG. 11 (dots are illustrated inside the hole parts 25, 26). The wiring electrodes 15 and 16 are able to be formed, for example, in the procedure as follows.

First, a not-shown seed layer for plating is formed on the in-groove insulating layer 22 and the protecting insulating layer 31. Next, a frame (not shown) including groove parts is formed on the seed layer. The frame is formed, for example, by patterning a photoresist by the photolithography. Further, a plating layer which will be parts of the wiring electrodes 15 and 16 is formed within the groove parts of the formed frame and on the seed layer. Subsequently, the frame is removed, and a part of the seed layer other than the part which exists under the plating layer is removed by etching. By the above processing, the wiring electrodes 15 and 16 are able to be formed of the plating layer and the seed layer thereunder.

Subsequently, laminating process is performed. In the laminating process, later-described laminated wafer 90 is manufactured by laminating of a plurality of substrates with electrode 11 manufactured by the above-described process.

First, as illustrated in FIG. 14, an insulating adhesive is applied on the first surface 1a of the substrate with electrode 11 to fix it to the base 34. In FIG. 14, the adhesive layer 33 made of the adhesive applied at this time is shown. The substrate with electrode 11 is used as the uppermost substrate disposed at the uppermost position of the later-described laminated wafer 90. The base 34 is a member for supporting the substrate with electrode 11, and a glass plate is used for the base 34 in FIG. 14. By applying the adhesive, the adhesive layer 33 is formed on the side of the first surface 1a of the substrate with electrode 11. This adhesive layer 33 is also formed inside the hole part 25, 26.

Subsequently, the second surface 1b of the substrate with electrode 11 is polished until the groove parts 20 and 21 appear so that the thickness of the substrate with electrode 11 is decreased as illustrated in FIG. 14. Then in the substrate with electrode 11, a shape, which only the in-groove insulating layer 22 is arranged just under the hole parts 25, 26, is obtained. Namely, by polishing of the second surface 1b of the substrate with electrode 11 until the groove parts 20 and 21 appear, a part of the silicon substrate 30 disposed under the groove parts 20 and 21 disappear. By this, the groove parts 21 become through groove parts. Accordingly, only resin is arranged, the inside of the hole parts 25, 26, on the extension line along to the laminated direction. Note that the substrate with electrode 11 which the base 34 is fixed is set the substrate with electrode 11A.

Figure 15:
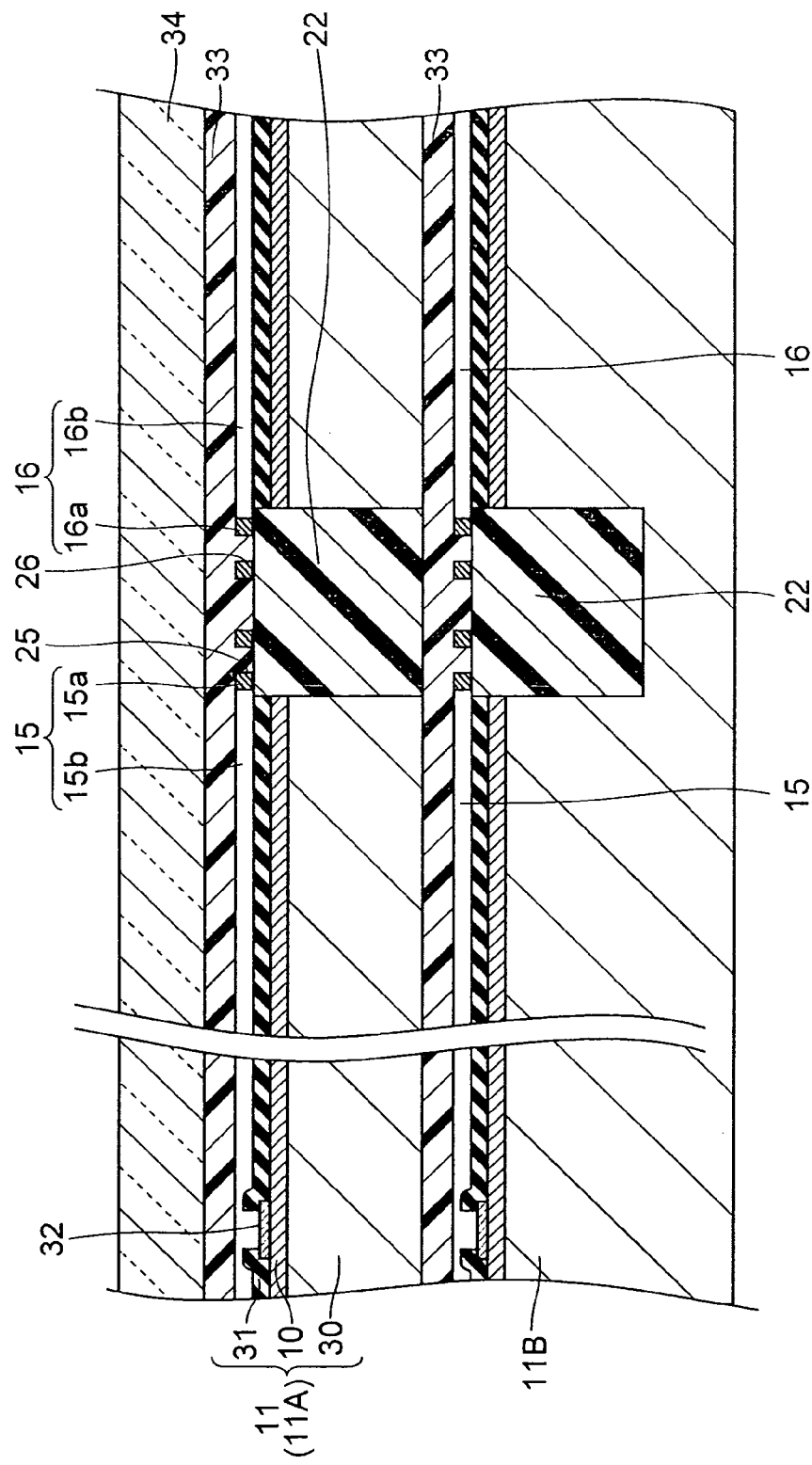
FIG. 15 is a sectional view similar to FIG. 12, illustrating the laminated semiconductor wafer subsequent to that in FIG. 14.

Next, another substrate with electrode 11B is bonded to the second surface 1b side of the substrate with electrode 11A as illustrated in FIG. 15 using an adhesive. In this event, position adjustment of the substrate with electrode 11A and the substrate with electrode 11B is performed such that the positions of the groove parts 20, 21 and the wiring electrodes 15, 16 of both of them coincide with each other. Then, the second surface 1b of the substrate with electrode 11B is polished until the groove parts 20 and 21 appear.

Figure 16:
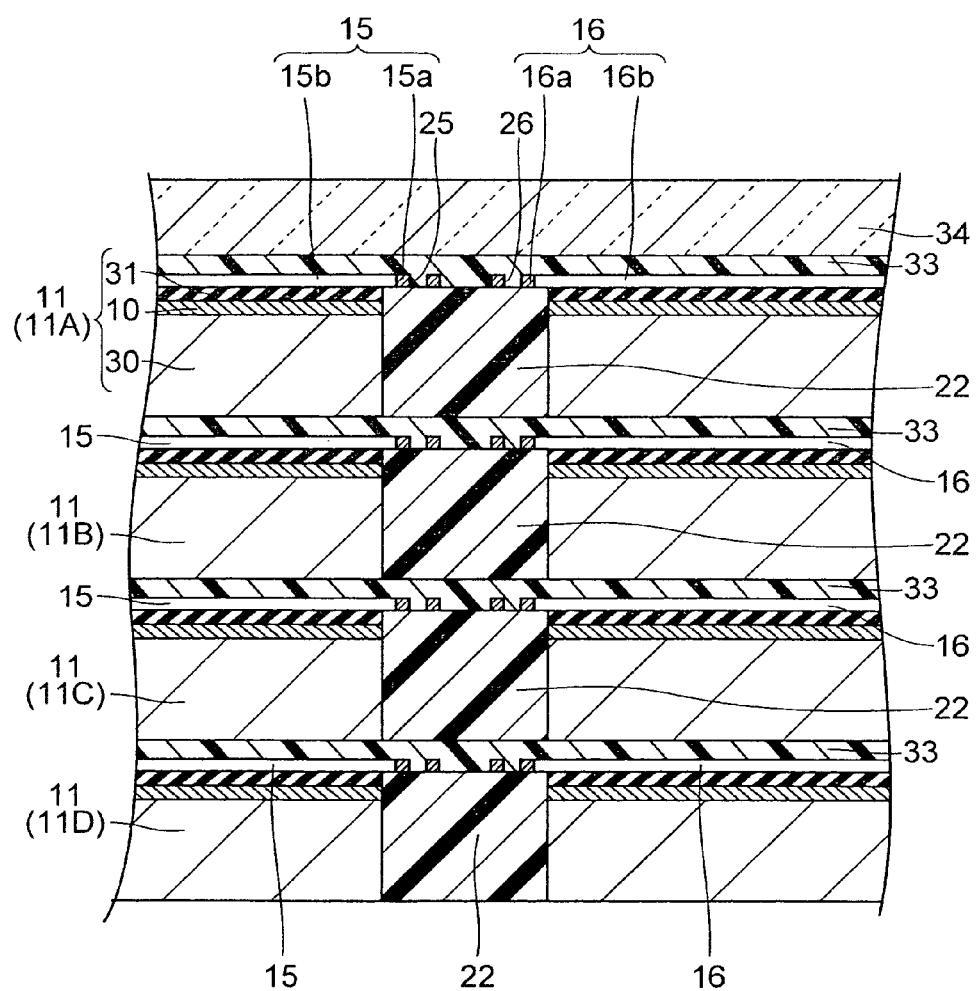
FIG. 16 is a sectional view similar to FIG. 12, illustrating the laminated semiconductor wafer subsequent to that in FIG. 15.

Further, as illustrated in FIG. 16, another substrate with electrode 11C, another substrate with electrode 11D are prepared. Then, for each of the substrates with electrode 11C, 11D, a process of bonding it to the second surface 1b side of the laminated body and polishing it (a bonding and polishing process) is performed.

Figure 17:
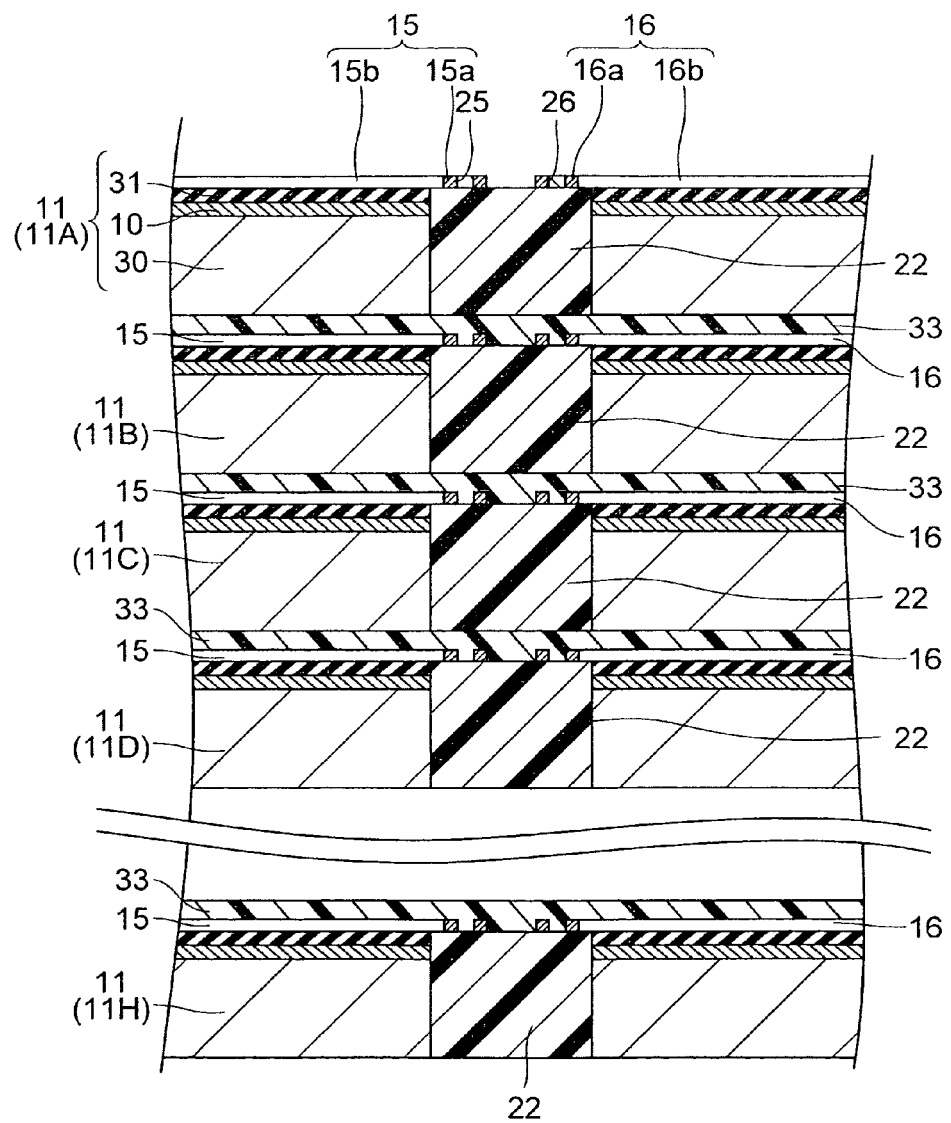
FIG. 17 is a sectional view similar to FIG. 12, illustrating the laminated semiconductor wafer subsequent to that in FIG. 16.
Figure 18:
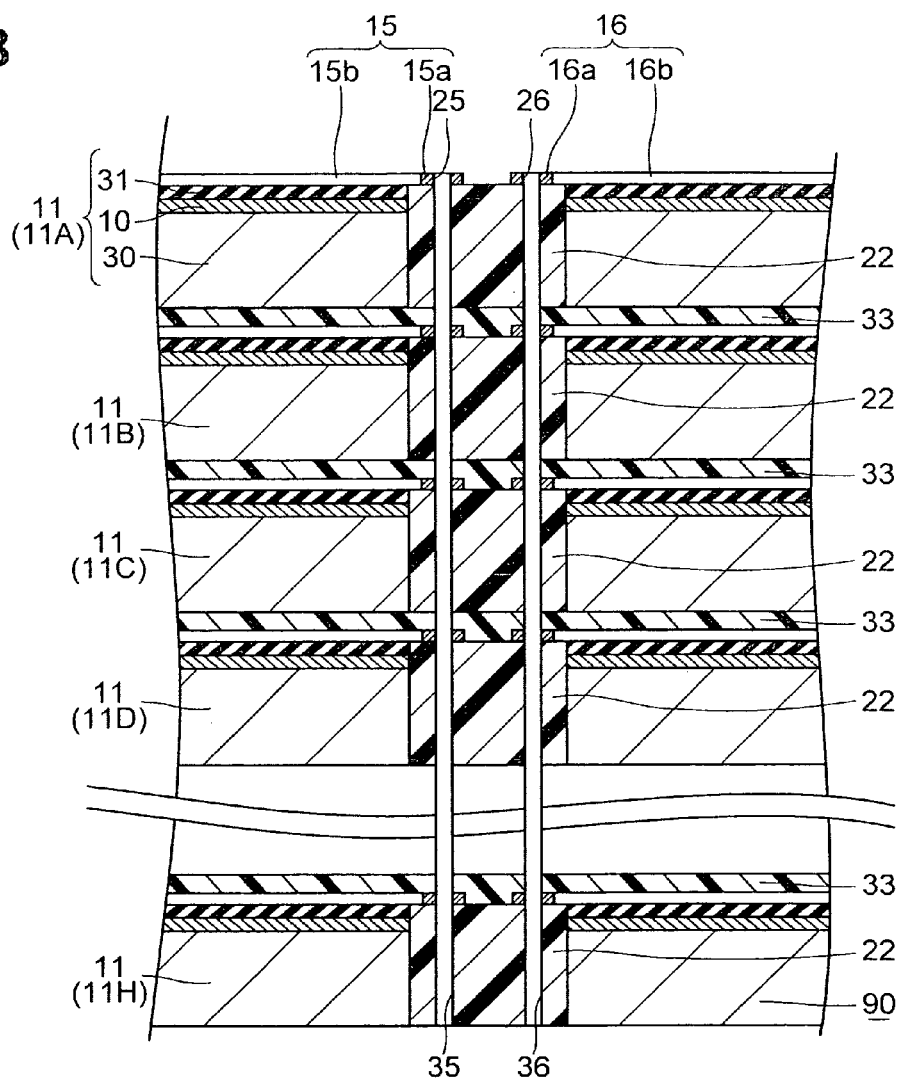
FIG. 18 is a sectional view similar to FIG. 12, illustrating the laminated semiconductor wafer subsequent to that in FIG. 17.
Figure 19:
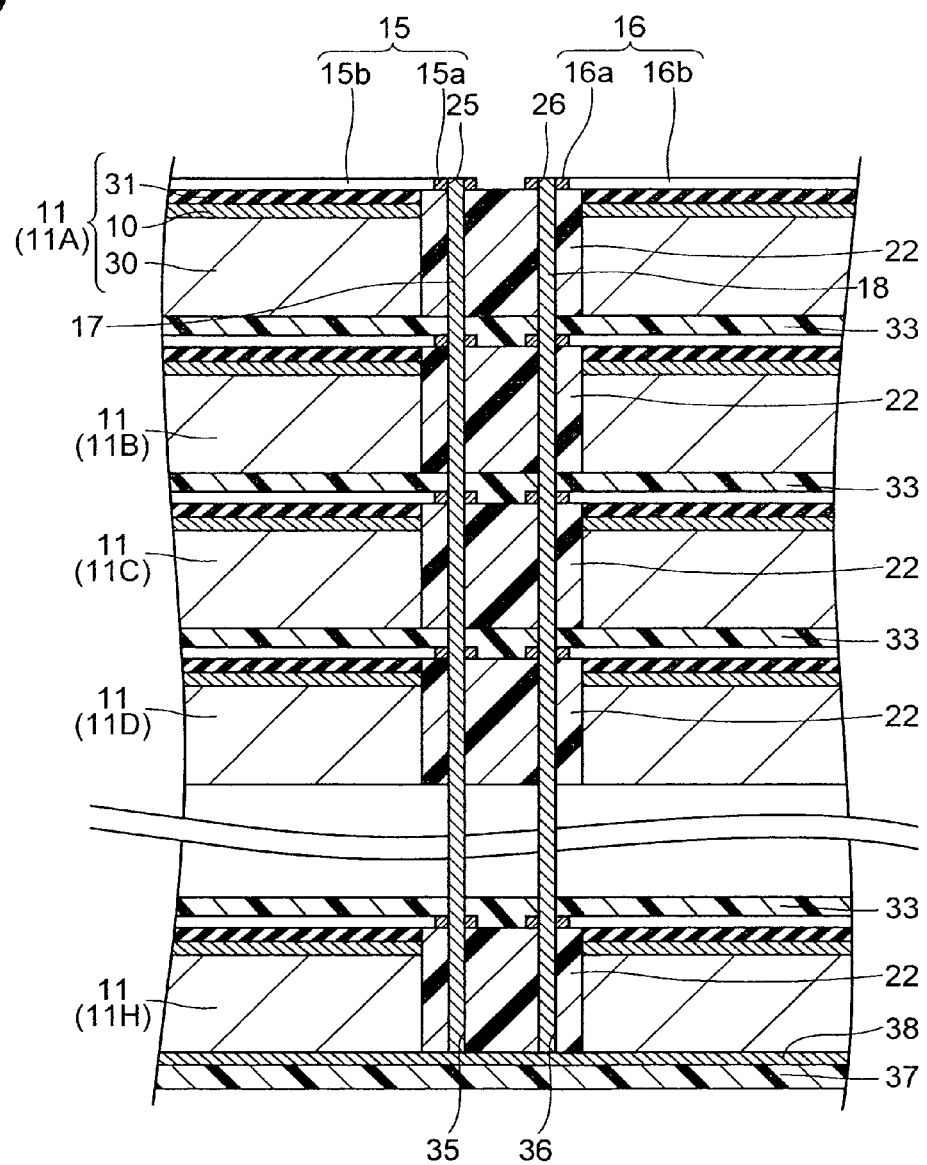
FIG. 19 is a sectional view similar to FIG. 12, illustrating the laminated semiconductor wafer subsequent to that in FIG. 18.

Continuously, as illustrated in FIG. 17, the bonding and polishing process is repeatedly performed for other three substrates with electrode 11 (illustration thereof is omitted in FIG. 17 to FIG. 19). Then, the bonding and polishing process is finally performed for the substrate with electrode 11H. As a result, the bonding and polishing process is performed for the eight substrates with electrode 11 in total.

Thereafter, when the base 34 and the adhesive layer 33 are removed about the substrate with electrode 11A, the laminated wafer 90 as shown in FIG. 17 is manufactured. In the laminated wafer 90, the substrate with electrode 11A is placed at the uppermost position, and the seven substrates with electrode 11 are stacked thereunder, so that the eight substrates with electrode 11 in total are laminated. In this laminated wafer 90, the wiring electrodes 15, 16 of the substrate with electrode 11A appear in the protruding shape because the base 34 and the adhesive layer 33 have been removed.

Next, through hole forming process is performed. In the through hole forming process, as illustrated in FIG. 18, through holes 35, 36 are formed in the laminated wafer 90 manufactured by the above-described process. The through holes 35, 36 are formed in such a manner that the through holes 35, 36 penetrate all of the groove parts 20, 21, the hole parts 25, 26, the in-groove insulating layers 22, and the adhesive layers 33 of the plurality of (eight) substrates with electrode 11 laminated in the direction (the laminated direction) in which the substrates with electrode 11 are laminated, and that the whole inner surfaces of the electrode pads 15a, 16a of all of the eight wiring electrodes 15, 16 laminated in the laminated direction appear in the through holes 35, 36.

The through holes 35, 36 can be formed, for example, by laser beam machining. In the laser beam machining, the laser beams are focused on a very small area and applied to the hole parts 25, 26 of the wiring electrodes 15, 16. Then, the energy of the applied laser beams melts the in-groove insulating layers 22 and the adhesive layers 33 on extension lines of the hole parts 25, 26 to form the through holes 35, 36 penetrating the in-groove insulating layers 22 and so on in the laminated direction from the regions where the laser beams are applied. To form the through holes 35, 36, the laser beams need to be applied only to the hole parts 25, 26. The laser beam machining is, however, preferable to form the through holes 35, 36 because the machined regions by the laser beam machining are very fine. In this case, in the laser beam machining, $CO_2$ laser (carbon dioxide gas laser) or THG (Third Harmonic Generation) laser can be used. Especially, the THG laser is suitable for machining the resin such as polyimide and the like and is suitable for finely forming the through holes 35, 36.

In addition to the laser beam machining, for example, RIE (Reactive Ion Etching) using oxygen plasma or IBE (Ion Beam Etching) may be applied to form the through holes 35, 36.

Subsequently, a through electrode forming process is executed. In the through electrode forming process, the through electrodes 17, 18 are formed inside the respective through holes 35, 36 formed in the above-described procedure as illustrated in FIG. 19. The through electrode 17, 18 is formed in a one-bar shape which is in contact with the whole inner surfaces of the electrode pads 15a, 16a of all of the wiring electrodes 15, 16 appearing in the through hole 35, 36 and penetrates all of the eight substrates with electrode 11 passing through the through hole 35, 36.

The through electrodes 17, 18 can be formed as follows, for instance. As illustrated in FIG. 19, a seed layer 38 is formed on the second surface 1b of the substrate with electrode 11H in the laminated wafer 90 using a holding plate 37 made of resin. The seed layer 38 is made of metal such as Cu or the like and used for forming a plating layer.

Next, electro-plating is performed by passing current through the seed layer 38. Then, a plating film grows from the surface of the seed layer 38 to fill the inside of the through holes 35, 36. Thus, the through electrodes 17, 18 are formed inside the through holes 35, 36. Since the through electrodes 17, 18 are formed by filling the plating film in the through holes 35, 36, the through electrodes 17, 18 come into contact with all of the wiring electrodes 15, 16 appearing in the through holes 35, 36. By forming the through electrodes 17, 18, the device regions 10 laminated in the laminated direction are connected.

Thereafter, electrode pads 27, 28 are formed on the second surface 1b of the substrate with electrode 11H in the laminated wafer 90, the laminated semiconductor wafer 100 is manufactured.

(Structure of Laminated Chip Package)

Figure 5:
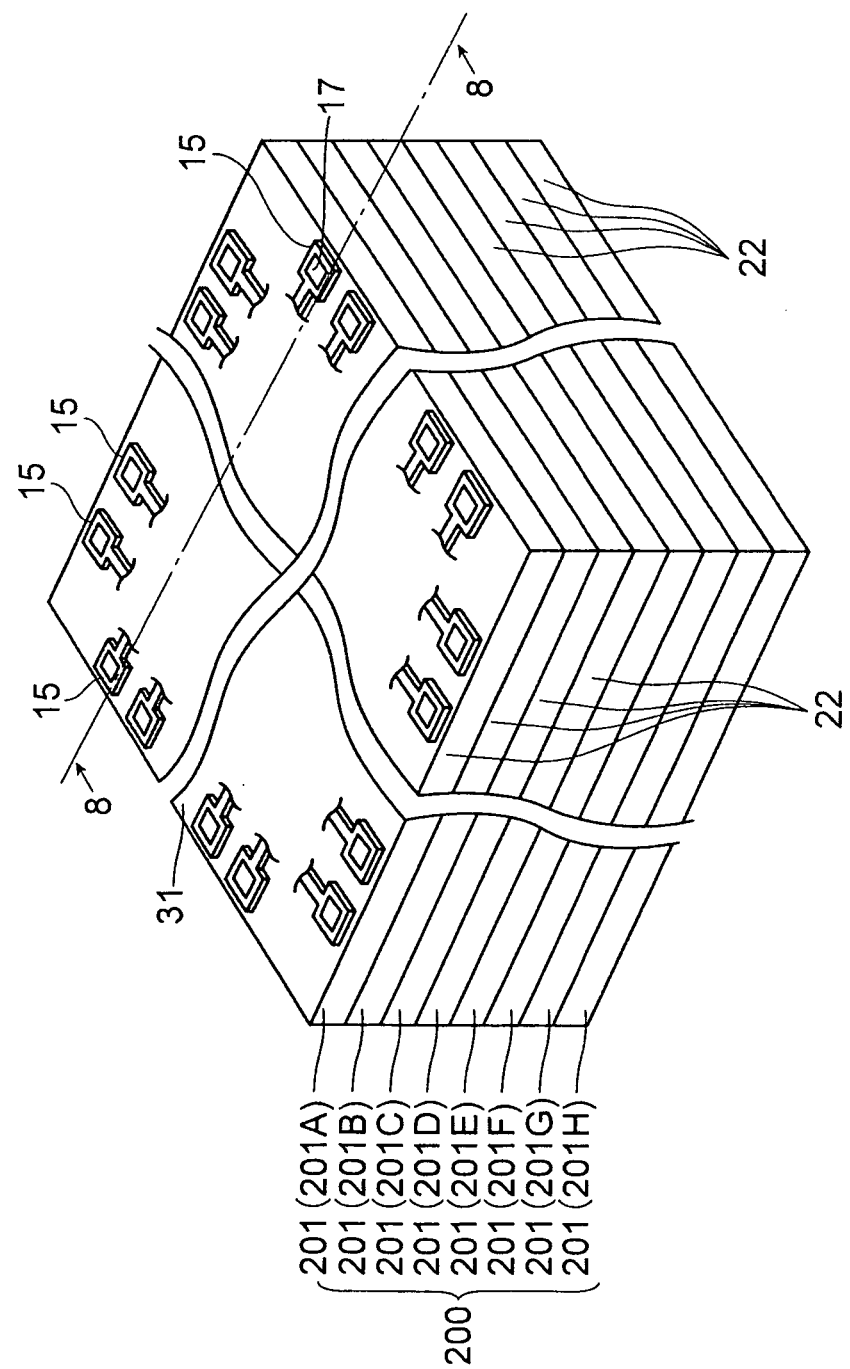
FIG. 5 is a perspective view of a laminated chip package according to the embodiment of the present invention seen from a front side.
Figure 6:
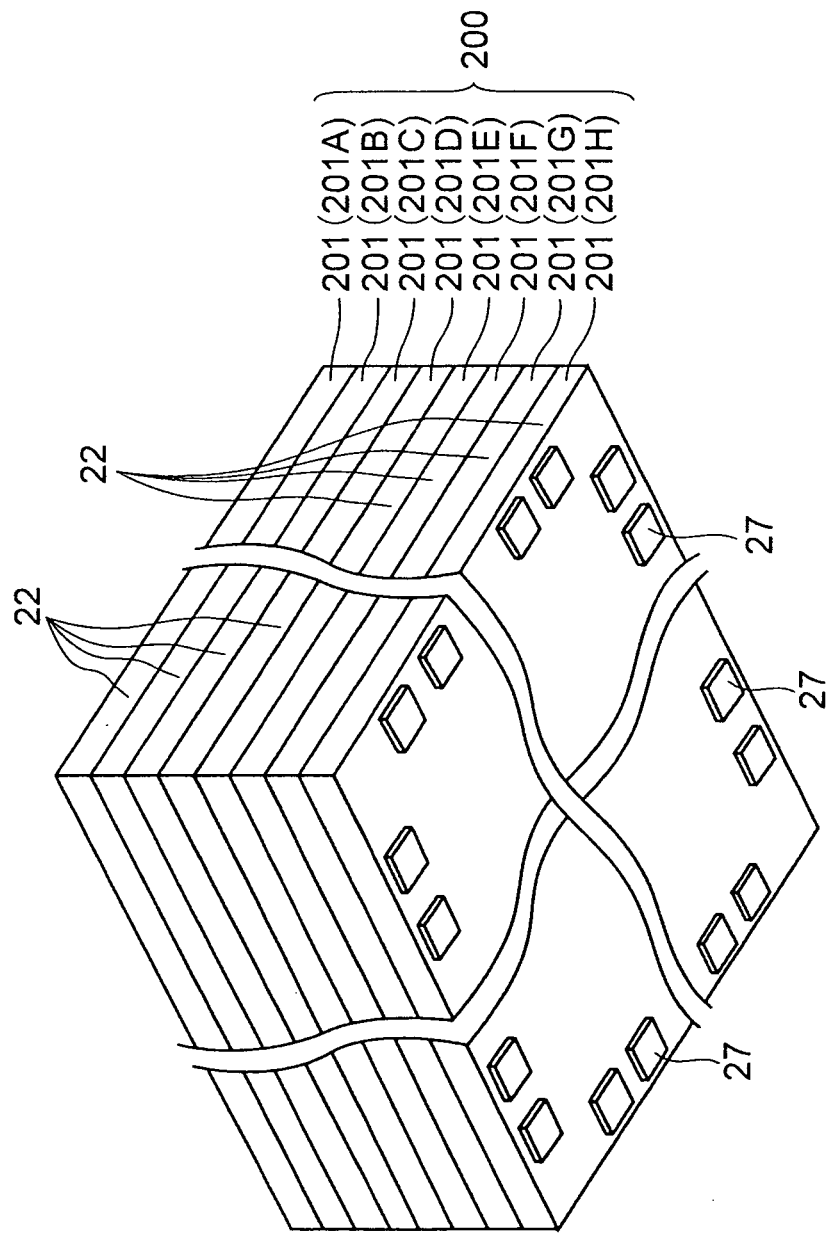
FIG. 6 is a perspective view of a laminated chip package according to the embodiment of the present invention seen from a rear side.
Figure 7:
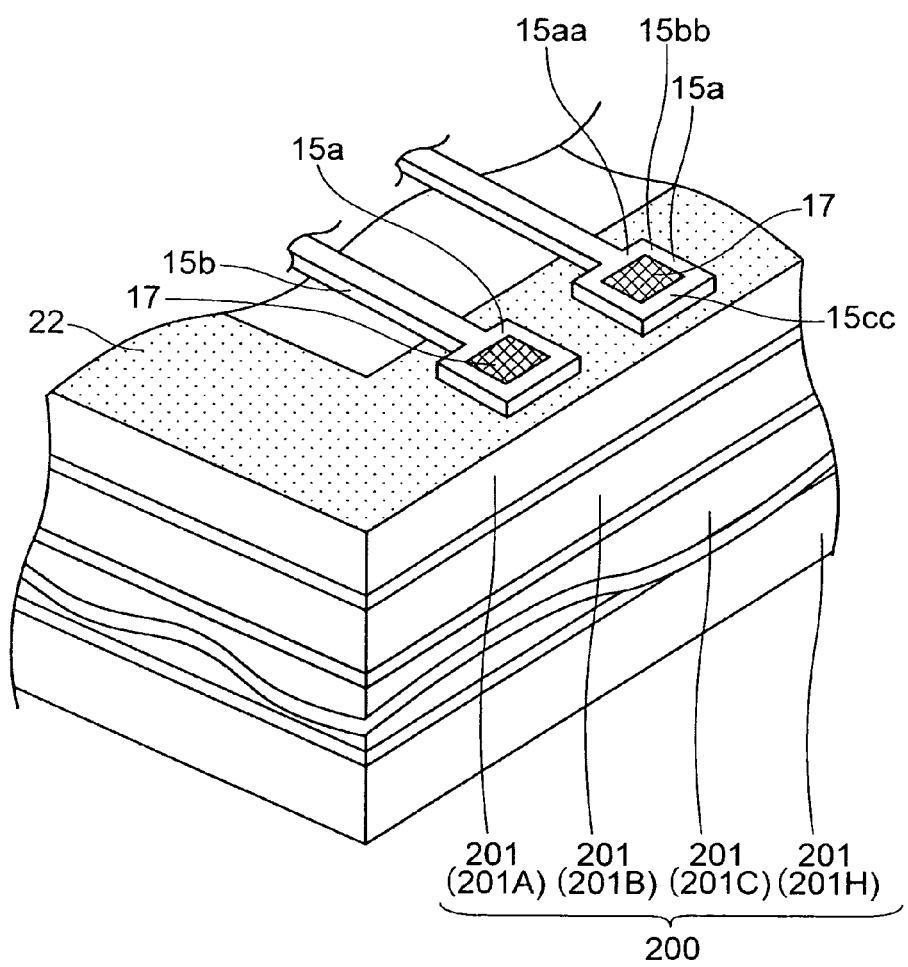
FIG. 7 is a perspective view illustrating a principal part of the laminated chip package with a part of it omitted.
Figure 8:
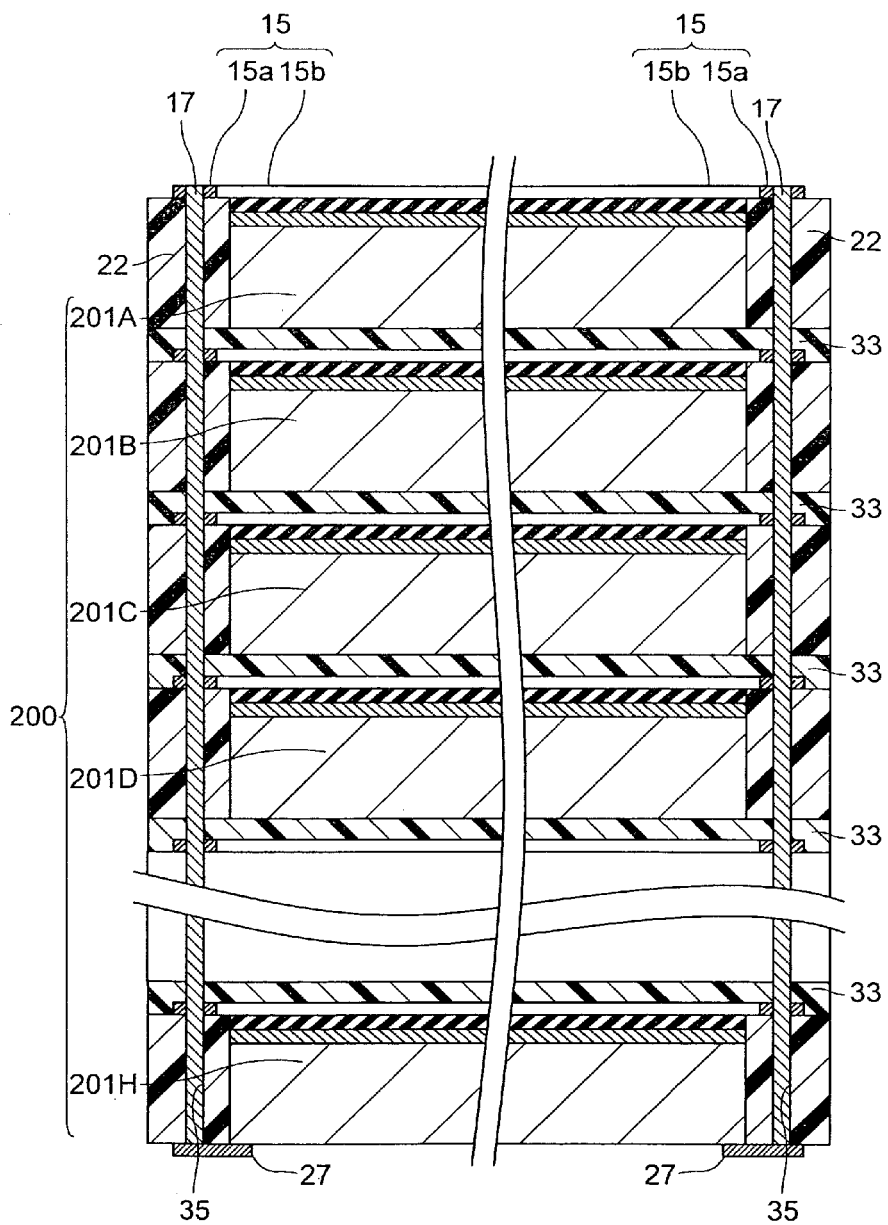
FIG. 8 is a sectional view taken along the line 8-8 in FIG. 5.

By using the laminated semiconductor wafer 100 having the above-described structure, a laminated chip package 200 is able to be manufactured. The structure of the laminated chip package 200 will be described as follows referring to FIG. 5 to FIG. 8. Here, FIG. 5 is a perspective view of a laminated chip package 200 seen from a front side. FIG. 6 is a perspective view of the laminated chip package 200 seen from a rear side. FIG. 7 is a perspective view illustrating a principal part of the laminated chip package 200 with a part of it omitted. FIG. 8 is a sectional view taken along the line 8-8 in FIG. 5.

The laminated chip package 200 is manufactured from the laminated chip region 40A, 40B in the above-described laminated semiconductor wafer 100. The laminated chip package 200 has a structure in which eight semiconductor chips 201 (201A, 201B, 201C, 201D, 201E, 201F, 201G, 201H) are laminated. In the laminated chip package 200, the semiconductor chip 201A as a surface chip is laminated at the uppermost position. Under the semiconductor chip 201A, seven semiconductor chips 201B to 201H are laminated. The semiconductor chips 201A to 201H are bonded together by the adhesive layers 33.

Further, since the laminated chip package 200 is manufactured from the laminated chip region 40A, 40B, a plurality of wiring electrodes 15 are formed on the front side. On the rear side, a plurality of electrode pads 27 are formed. The laminated chip package 200 has the in-groove insulating layers 22 as the resin insulating layers made of insulating resin which are formed to surround the periphery of the laminated chip package 200. The laminated chip package 200 is covered by the in-groove insulating layers 22 in the whole peripheral direction.

In addition, a plurality of through holes 35 are formed in the laminated chip package 200, and the through electrodes 17 are formed in the respective through holes 35. Each of the through holes 35 penetrates the eight wiring electrodes 15 constituting the laminated electrode group 55, the in-groove insulating layers 22, and the adhesive layers 33 of the semiconductor chips 201A to 201H. The through electrode 17 is a conductor in a one-bar shape passing through the through hole 35 and is in direct contact with the electrode pads 15a of the eight wiring electrodes 15 constituting the laminated electrode group 55.

The laminated chip package 200 is able to realize memories with various storage capacities such as 64 GB (gigabyte), 128 GB, and 256 GB by varying the memory parts in the semiconductor wafer 1. Note that eight semiconductor chips are laminated in the laminated chip package 200. However, it is sufficient that a plurality of semiconductor chips are laminated, and the number of the semiconductor chips which are laminated within the laminated chip package 200 is not limited to eight.

Since the laminated chip package 200 having the above-described structure can be manufactured using the laminated semiconductor wafer 100, more laminated chip packages 200 can be manufactured in a short time. Accordingly, the manufacturing cost of the laminated chip package 200 can be reduced.

Further, the laminated chip package 200 has the through electrode 17 as in the laminated semiconductor wafer 100, and thus has a structure in which the contact resistance caused by the contact between conductors for connecting the semiconductor chips 201 does not occur. Furthermore, all of the semiconductor chips 201 are connected by the through electrode 17. The through electrode 17 is a conductor in a one-bar shape without joint, and thus has a contact resistance lower than the contact resistance in the case where the respective semiconductor wafers 100 are connected by the wiring individually formed in each semiconductor chip 201. Further, since the peripheral surface of the through electrode 17 is in contact with all inner surfaces of the electrode pad 15a facing the hole part 25, a larger contact area is secured between the electrode pad 15a and the through electrode 17 so that the current smoothly flows.

(Method of Manufacturing Laminated Chip Package)

Continuously, the laminated chip package 200 having the above-described structure is able to be manufactured by using the laminated semiconductor wafer 100. In this case, when the laminated semiconductor wafer 100 is cut along the scribe lines 3A and 3B by using the dicing saw, respective laminated chip regions such as the laminated chip regions 40A, 40B are divided into block-like pieces. The respective divided block-like pieces will be the laminated chip packages 200.

When cutting the laminated semiconductor wafer 100, the cutting is performed, as illustrated in FIG. 4, such that a cut line CL by the blade passes through the space between the adjacent wiring electrodes 15 and wiring electrodes 16 and the blade does not come into contact with the wiring electrodes 15 and the wiring electrodes 16. By this, the laminated chip package 200 can be structured such that it is covered by the in-groove insulating layers 22 in the whole peripheral direction.

For the blade to pass through the space between the adjacent wiring electrodes 15 and wiring electrodes 16, the following is set. Here, where the width of the blade is Wb and the distance between the wiring electrode 15 and the wiring electrode 16 is W1, W1≧Wb is set as illustrated in FIG. 27(a). This means that the wiring electrode 15 and the wiring electrode 16 are formed to provide a distance larger than the width Wb of the blade. The distance is set to establish W1≧Wb by devising the size and the arrangement of the electrode pads 15a, 16a of the wiring electrode 15 and the wiring electrode 16.

Conversely, in the case of W1<Wb, parts of the extended terminal parts 15cc, 16cc of the electrode pads 15a, 16a will be cut as illustrated in FIG. 27(b) when the laminated semiconductor wafer 100 is cut. This will form a shape in which the sections of the extended terminal parts 15cc, 16cc are exposed in the periphery of the laminated chip package 200. Even in this case, it is possible to prevent the blade from passing through the hole parts 25, 26, and thus possible to maintain the contact state between the through electrodes 17, 18 and the wiring electrodes 15, 16 (illustration of the through electrodes 17, 18 in FIGS. 27(a), (b) and FIGS. 28(a), (b) is omitted).

Further, it is assumed that Wb>W1+2Wd is set where both the widths of the extended terminal parts 15cc, 16cc in the direction across the groove part 21 are Wd. Then, the blade passes through the insides of the hole parts 25, 26 as illustrated in FIG. 28(a) when the laminated semiconductor wafer 100 is cut, so that the through electrodes 17, 18 are cut. This reduces the areas of parts where the through electrodes 17, 18 are in contact with the wiring electrodes 15, 16, and the flow of current may be deteriorated.

Besides, it is assumed that Wb>W1+2Wd+2We is set where both the widths of the hole parts 25, 26 in the direction across the groove part 21 are We. Then, the blade will pass through the whole hole parts 25, 26 and most of the wiring electrodes 15, 16 as illustrated in FIG. 28(b) when the laminated semiconductor wafer 100 is cut. This removes the through electrodes 17, 18 when the laminated semiconductor wafer 100 is cut along the groove parts 20, 21.

Accordingly, it is preferable that the following relational expression is satisfied by devising the size, the shape, the arrangement and so on of the wiring electrode pads 15a, 16a of the wiring electrode 15 and the wiring electrode 16 in the laminated semiconductor wafer 100. This makes it possible for the blade to pass through the space between the hole parts 25, 26 and not contact with the hole parts 25, 26 when the laminated semiconductor wafer 100 is cut.

Relational expression: $Wb \leq W1 + 2Wd$

By satisfying the above relational expression, at least the situation that the through electrodes 17, 18 are cut as illustrated in FIG. 27(b) can be avoided. By this, the contact state between the through electrodes 17, 18 and the wiring electrodes 15, 16 can be maintained also in the completed laminated chip package 200 as in the same state of the laminated semiconductor wafer 100.

Second Embodiment

Figure 23:
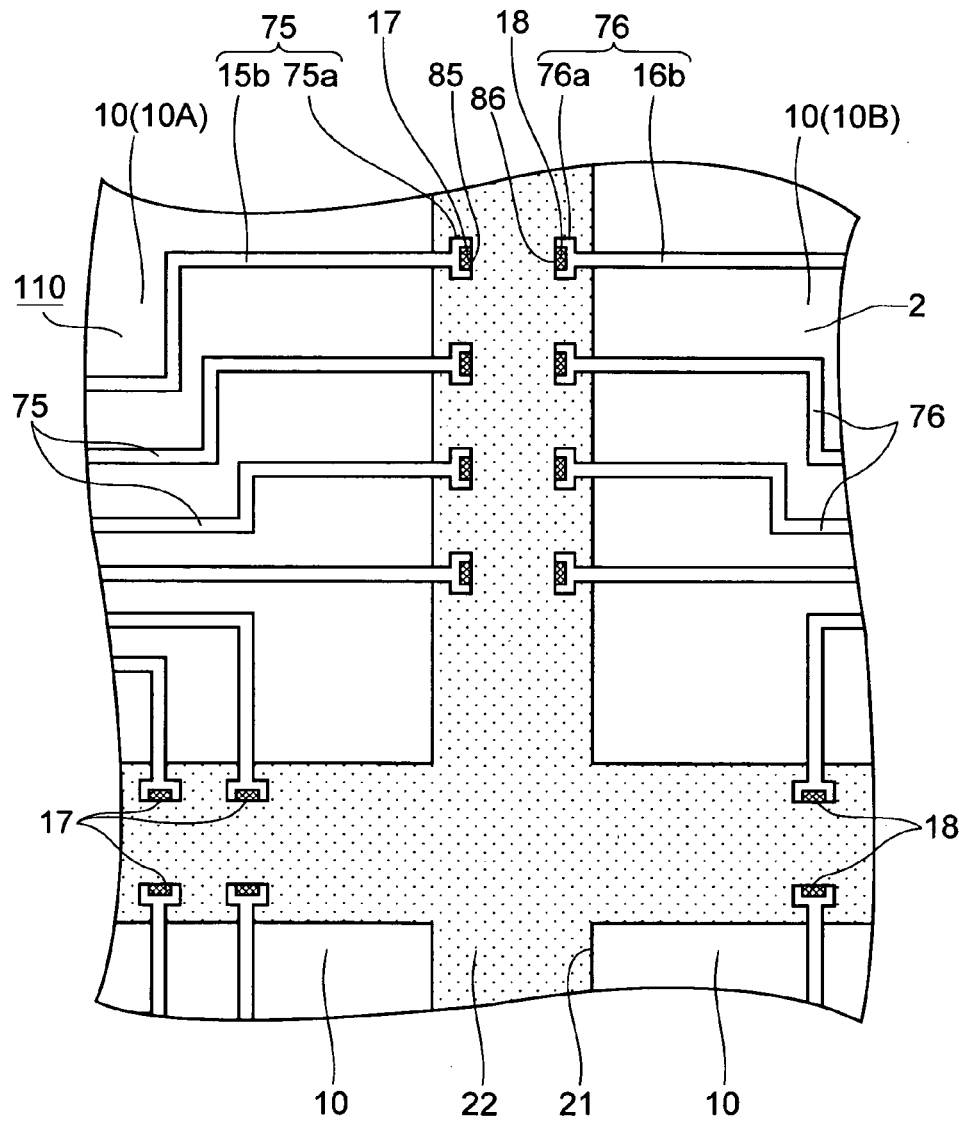
FIG. 23 is a plan view illustrating a principal part of the two device regions of the laminated semiconductor wafer according to a second embodiment of the present invention.
Figure 24:
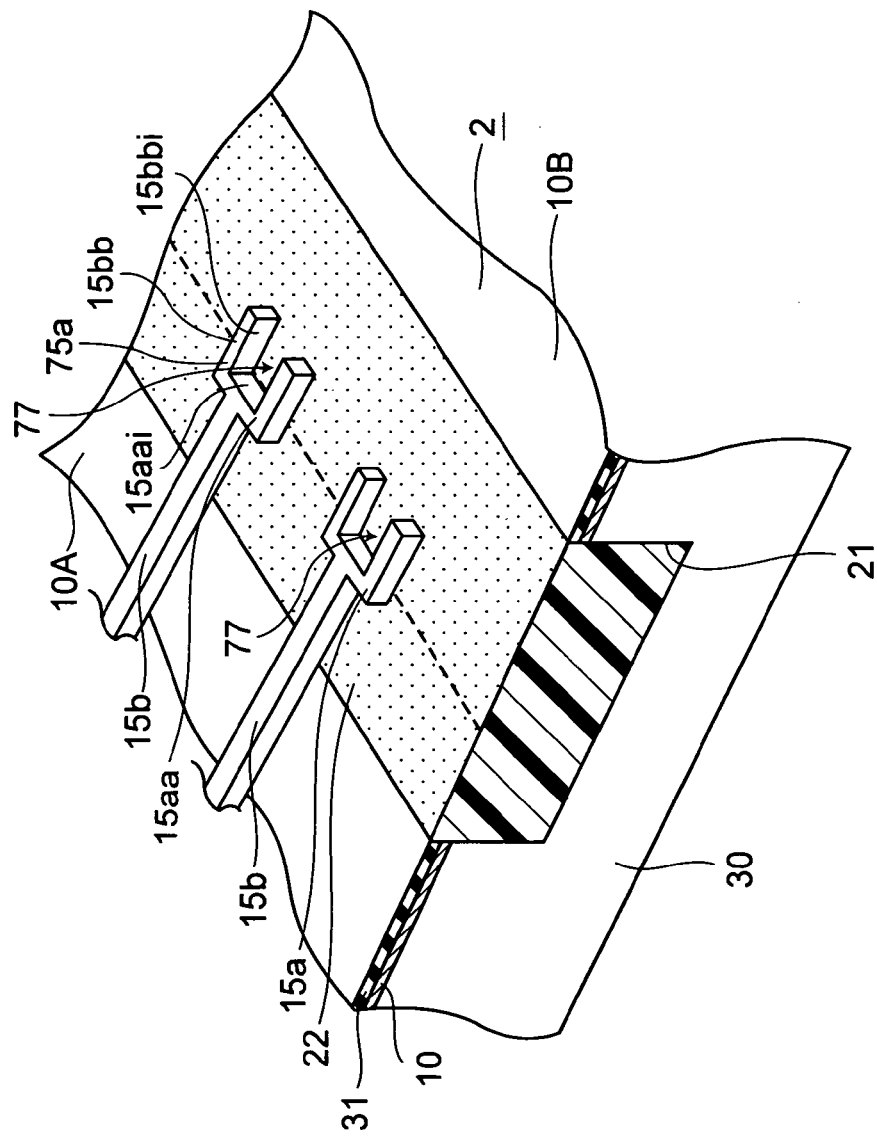
FIG. 24 is a perspective view illustrating a principal part of the semiconductor wafer constituting the partially manufactured laminated semiconductor wafer in FIG. 23.

Continuously, a laminated semiconductor wafer 110 according to a second embodiment of the present invention will be described with reference to FIG. 23 and FIG. 24. Here, FIG. 23 is a plan view illustrating a principal part of the two device regions 10 of the laminated semiconductor wafer 110. FIG. 24 is a perspective view illustrating a principal part of the partially manufactured semiconductor wafer 2.

The laminated semiconductor wafer 110 is different in that it is manufactured by using a semiconductor wafer 2, as compared with the laminated semiconductor wafer 100. A plurality of semiconductor wafers 2 are laminated in the laminated semiconductor wafer 110.

The semiconductor wafer 2 is different in that it has wiring electrodes 75 and 76 in place of wiring electrodes 15 and 16, as compared with the semiconductor wafer 1. The wiring electrodes 75 and 76 are different in that they have electrode pads 75a, 76a in place of electrode pads 15a, 16a, as compared with the electrodes 15 and 16.

The electrode pads 75a, 76a are different in that they do not have extended terminal parts 15cc, 16cc, as compared with the electrode pads 15a, 16a. Namely, describing the electrode pad 75*a* in more detail, the electrode pad 75*a* has a base part 15*aa* and two crossing parts 15*bb*, and is formed in a deformed U-shape surrounding the periphery of a hole part 77 as illustrated in detail in FIG. 24. Further, the two crossing parts 15*bb* are arranged to open to the inside the groove part 21. Furthermore, the hole part 77 is formed inside the base part 15*aa* and the two crossing parts 15*bb*.

In the laminated semiconductor wafer 110, a plurality of through holes 85, 86 similar to the through holes 35, 36 in the laminated semiconductor wafer 100 are formed, and each of through electrodes 17, 18 is formed inside each of the through holes 85, 86, respectively. Note that since FIG. 24 illustrates the partially manufactured semiconductor wafer 2, the through electrodes 17 and the through holes 85 are not illustrated.

The above-described laminated semiconductor wafer 110, similar to the laminated semiconductor wafer 100, has the wiring electrodes 75 and 76 separated from each other. The two device regions 10A, 10B adjacent to each other are electrically insulated by the in-groove insulating layer 22. Therefore, in the laminated semiconductor wafer 110, similar to the laminated semiconductor wafer 100, the package inspection for the individual laminated chip package is able to be performed in a state of the wafer structure, the laminated semiconductor wafer 110 has a structure in which the package inspection is easily performed for the whole individual laminated chip packages. Therefore, the use of the laminated semiconductor wafer 110 also enables to reduce the manufacturing time of the laminated chip packages, the number of the laminated chip packages manufacturable per unit time can be increased.

Besides, since the laminated semiconductor wafer 110 has the through electrode 17, 18 similar to the laminated semiconductor wafer 100, in the laminated semiconductor wafer 110, the time required for forming the through electrodes can be reduced. Accordingly, the number of the laminated semiconductor wafer 110 manufacturable per unit time can be also further increased by further reducing the manufacturing time. Further, since the laminated semiconductor wafer 110 has the through holes 85, 86 similar to the through holes 35, 36, in the laminated semiconductor wafer 110, it is also possible that the time required for forming the through holes 85, 86 is reduced. Therefore, the number of the laminated semiconductor wafer 110 manufacturable per unit time can be still further increased by still further reducing the manufacturing time.

Meanwhile, since the wiring electrodes 75, 76 do not have the extended terminal parts 15*cc*, 16*cc*, a contact area between the wiring electrodes 75, 76 and the through electrode 17, 18 is reduced as compared with the wiring electrodes 15, 16. However, since the three inner surfaces of the wiring electrodes 75, 76 are in contact with the through electrode 17, 18, contacts between the electrode pads 75*a*, 76*a* and the through electrode 17, 18 are secured sufficient level for practical use.

Further, since the electrode pads 75*a*, 76*a* of the wiring electrodes 75, 76 are opposed to each other, the laminated semiconductor wafer 110 has a structure in which the package inspection is easily performed.

Third Embodiment

Figure 25:
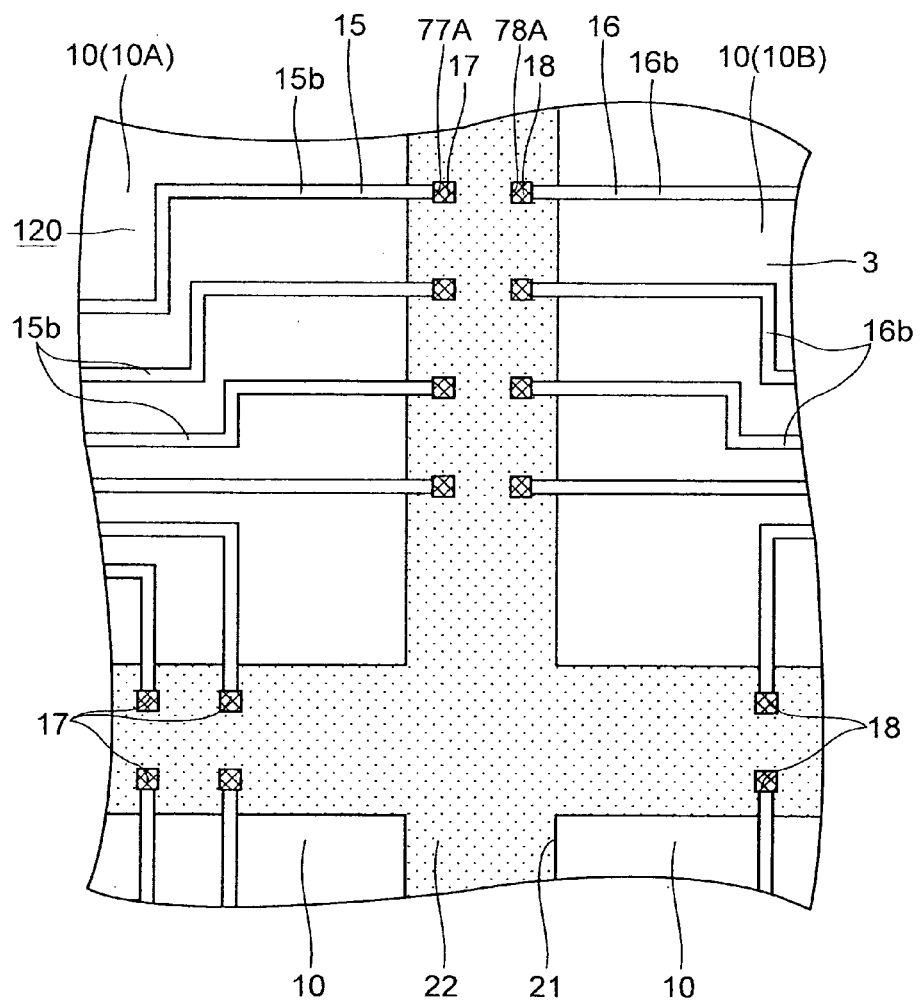
FIG. 25 is a plan view illustrating a principal part of the two device regions of the laminated semiconductor wafer according to a third embodiment of the present invention.
Figure 26:
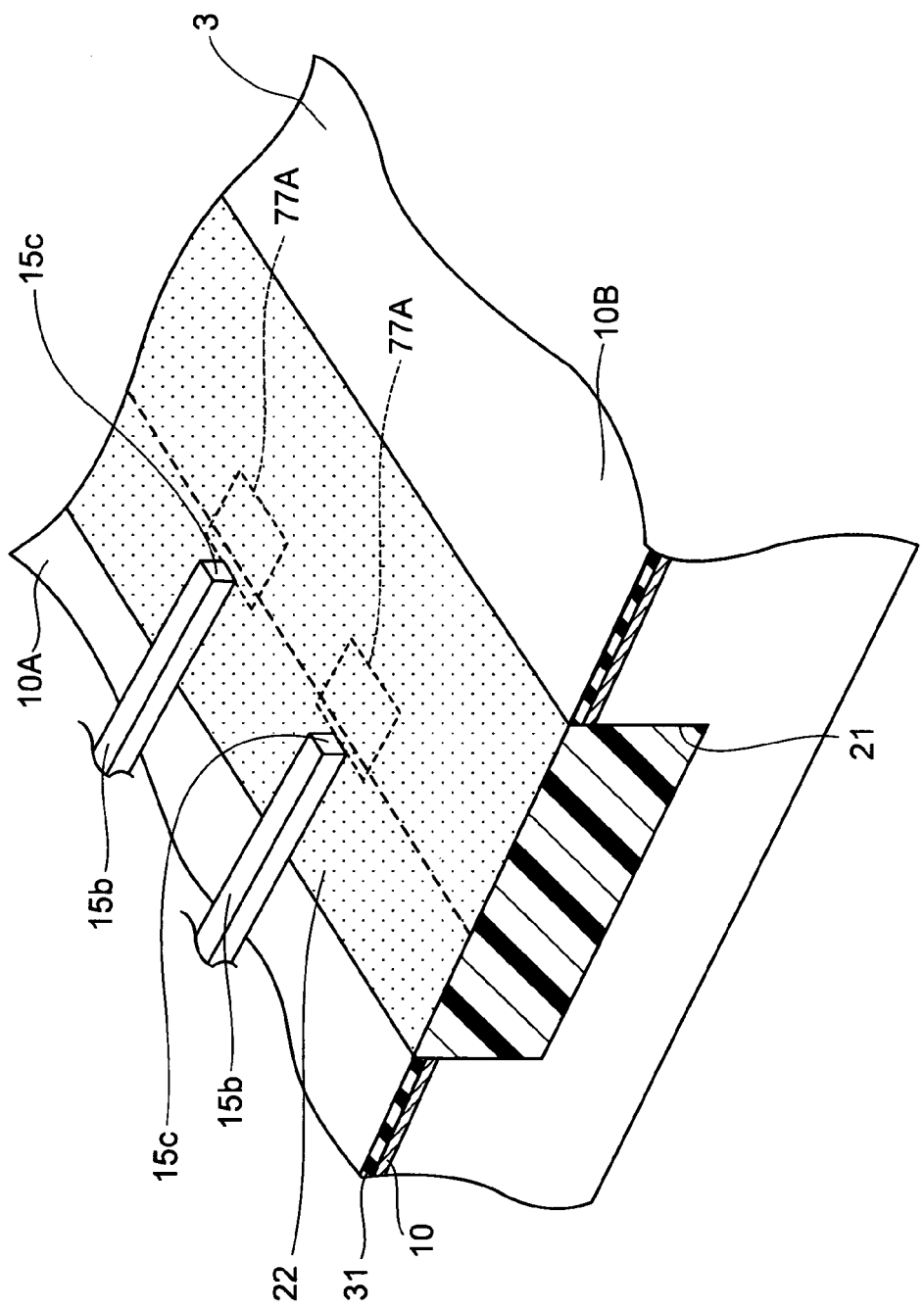
FIG. 26 is a perspective view illustrating a principal part of the semiconductor wafer constituting the partially manufactured laminated semiconductor wafer in FIG. 25.

Continuously, a laminated semiconductor wafer 120 according to a third embodiment of the present invention will be described with reference to FIG. 25 and FIG. 26. Here, FIG. 25 is a plan view illustrating a principal part of the two device regions 10 of the laminated semiconductor wafer 120. FIG. 26 is a perspective view illustrating a principal part of the partially manufactured semiconductor wafer 3.

The laminated semiconductor wafer 120 is different in that it is manufactured by using a semiconductor wafer 3, as compared with the laminated semiconductor wafer 100. A plurality of semiconductor wafers 3 are laminated in the laminated semiconductor wafer 120.

The semiconductor wafer 3 is different in that the respective wiring electrodes 15, 16 of it do not have electrode pads 15*a*, 16*a*, they have only a line-shape terminal parts 15*b*, 16*b*, as compared with the semiconductor wafer 1.

In the laminated semiconductor wafer 120, a plurality of each of through holes 77A, 78A similar to the through holes 35, 36 in the laminated semiconductor wafer 100 are formed, and each of through electrodes 17, 18 is formed inside each of the through holes 77A, 78A, respectively. Further, since FIG. 26 illustrates the partially manufactured semiconductor wafer 3, the through electrodes 17 are not illustrated. Since the through holes 77A will be formed later, the through holes 77A are indicated by a dotted line in FIG. 26.

Each of through holes 77A is different in that it is formed such that the tip parts 15*c* of the line-shape terminal parts 15*b* appears, as compared with the through holes 35 of the laminated semiconductor wafer 100. In case of this laminated semiconductor wafer 120, since the tip parts 15*c* of the line-shape terminal parts 15*b* is extending to the innermost of the groove part 21, the tip parts 15*c* is an endmost part. In the laminated semiconductor wafer 120, the tip parts 15*c* is opposed to a not-shown tip part of the line-shape terminal parts 16*b*.

The above-described laminated semiconductor wafer 120, similar to the laminated semiconductor wafer 100, has the wiring electrodes 15 and 16 separated from each other. The two device regions 10A, 10B adjacent to each other are electrically insulated by the in-groove insulating layer 22. Therefore, in the laminated semiconductor wafer 120, similar to the laminated semiconductor wafer 100, the package inspection for the individual laminated chip package is able to be performed in a state of the wafer structure, the laminated semiconductor wafer 120 has a structure in which the package inspection is easily performed for the whole individual laminated chip packages. Therefore, the use of the laminated semiconductor wafer 120 also enables to reduce the manufacturing time of the laminated chip packages, the number of the laminated chip packages manufacturable per unit time can be increased.

Besides, since the laminated semiconductor wafer 120 has the through electrode 17, 18 similar to the laminated semiconductor wafer 100, in the laminated semiconductor wafer 120, the time required for forming the through electrodes can be reduced. Accordingly, the number of the laminated semiconductor wafer 120 manufacturable per unit time can be further increased by further reducing the manufacturing time. Further, since the laminated semiconductor wafer 120 has the through holes 77A, 78A similar to the through holes 35, 36, in the laminated semiconductor wafer 120, it is also possible that the time required for forming the through holes 77A, 78A is reduced. Therefore, the number of the laminated semiconductor wafer 120 manufacturable per unit time can be still further increased by still further reducing the manufacturing time.

Meanwhile, since the laminated semiconductor wafer 120 do not have the electrode pads 15*a*, 16*a*, a contact area between the wiring electrodes 15, 16 and the through electrode 17, 18 is reduced as compared with the laminated semiconductor wafer 100. However, regarding the wiring electrodes 15 and the through electrode 17, since the tip parts 15*c* is in contact with the through electrode 17, a contact between the wiring electrodes 15 and the through electrodes 17 are secured. A contact between the wiring electrodes 16 and the through electrodes 18 are also secured.

Other Embodiments

Figure 29:
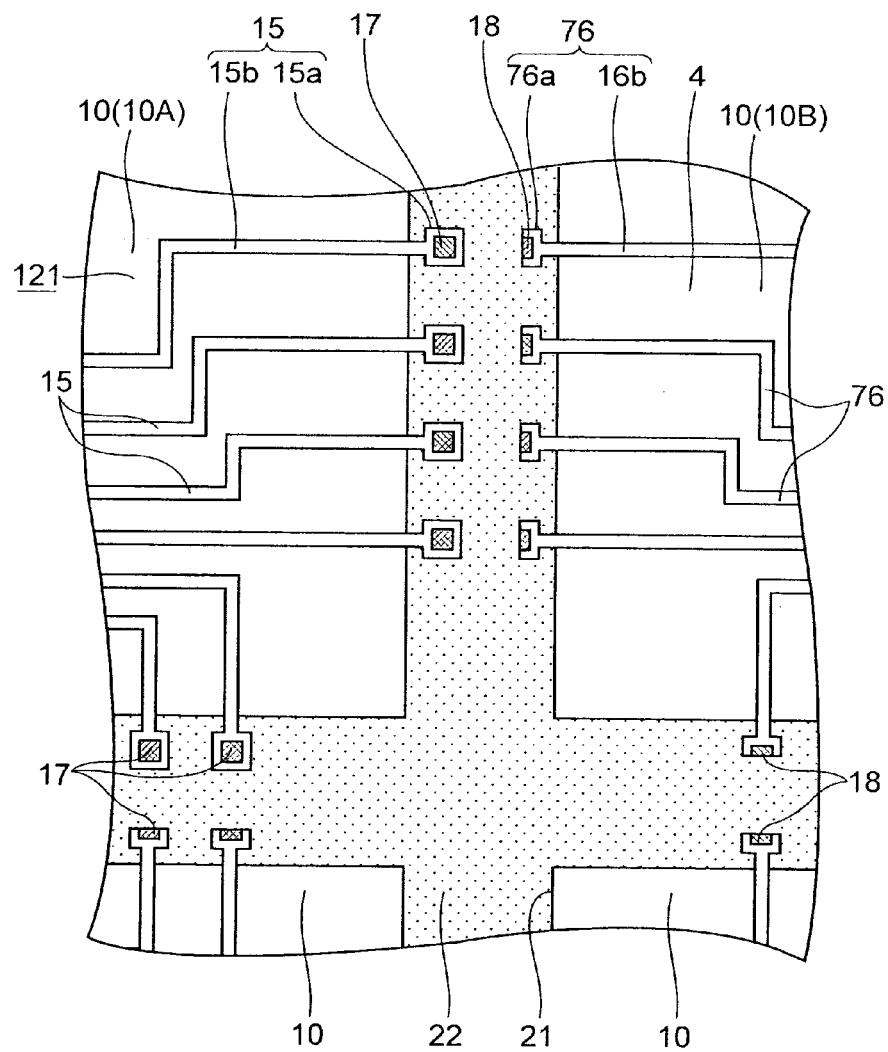
FIG. 29 is a plan view illustrating a principal part of two device regions of the laminated semiconductor wafer according to another embodiment.

A laminated semiconductor wafer 121 will be described with reference to FIG. 29. Here, FIG. 29 is a plan view illustrating a principal part of two device regions 10 of a semiconductor wafer 4 constituting the laminated semiconductor wafer 121.

Though the wiring electrodes having the same shape (for example, the wiring electrodes 15, 16) are formed with the groove part intervening therebetween in each of the above-described laminated semiconductor wafers, wiring electrodes in different shapes may also be formed. For example, as illustrated in FIG. 29, the laminated semiconductor wafer 121 can be formed using the semiconductor wafer 4 in which wiring electrodes 76 are formed in place of the wiring electrodes 16.

Figure 30:
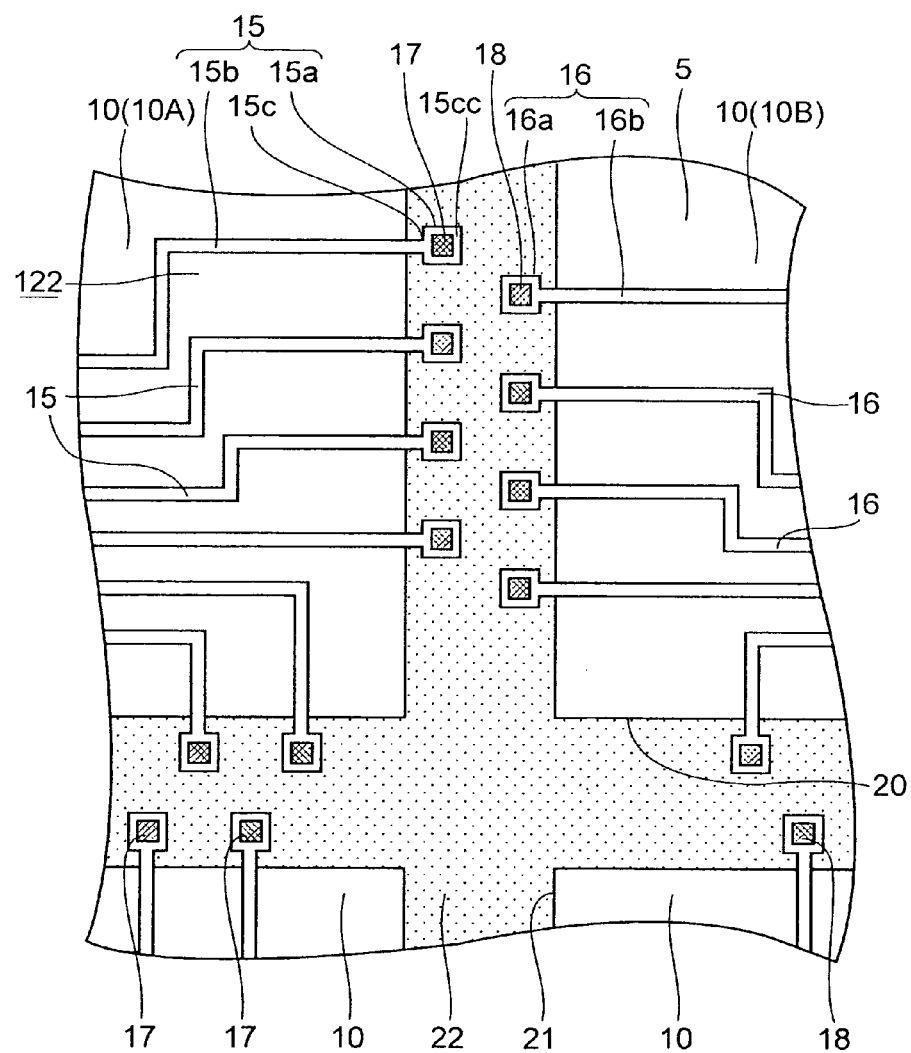
FIG. 30 is a plan view illustrating a principal part of two device regions of the laminated semiconductor wafer according to still another embodiment.

Meanwhile, the wiring electrodes having the same shape (for example, the wiring electrodes 15, 16) are formed to be opposed to each other with the groove part intervening therebetween in each of the above-described laminated semiconductor wafers. A laminated semiconductor wafer 122 may be formed in which semiconductor wafers 5 illustrated in FIG. 30 are laminated. The semiconductor wafer 5 has the wiring electrodes 15, 16, but the wiring electrodes 15, 16 are formed such that the positions of the wiring electrodes 15, 16 are displaced from each other so that they are not opposed to each other. However, the wiring electrodes 15, 16 are separated from each other and the device regions 10A, 10B are insulated also in the laminated semiconductor wafer 122, so that the package inspection can be performed for the individual laminated chip package in a state of the wafer structure.

In the above embodiments, the groove parts 20, 21 are formed on the semiconductor wafer 1, and so on. However, only the groove parts 21 may be formed without forming the groove parts 20. In the case of this laminated semiconductor wafer, a plurality of groove parts 21 are arranged at regular intervals and the groove parts are formed in the shape of stripes not intersecting with each other, in the semiconductor wafer 1. Further, the groove part 21 may be formed along every other scribe line 3B.

In the above-described embodiments, the laminated electrode group 55 is composed of eight common wiring electrodes laminated in the laminated direction. The wafer test is performed by measuring the electrical characteristics in each chip planned part for each semiconductor wafer 1 before lamination. As a result of performing the wafer test and the quality judgment on each chip planned part, a bad chip planned part may be included in the semiconductor wafer 1. However, only good chip planned parts need to be used for the laminated chip package 200.

Therefore, when a bad chip planned part is included in the semiconductor wafer 1, it is preferable not to form the wiring electrode in the bad chip planned part. In this case, the positional information of the bad chip planned part is saved during the wafer test so that the wiring electrode is not formed in the device region according to the positional information in the substrate manufacturing process. By this, the bad chip planned part can be excluded from the subject for electrical connection, though the bad chip planned part is physically included in the laminated chip package.

Further, the laminated chip package including the bad chip planned part may be excluded as a bad product. In this case, identification information of the semiconductor wafer including the bad chip planned part is saved together with the positional information of the bad chip planned part, and the laminated chip package including the bad chip planned part may be excluded at a stage of the package inspection according to the positional information and the identification information.

This invention is not limited to the foregoing embodiments but various changes and modifications of its components may be made without departing from the scope of the present invention. Besides, it is clear that various embodiments and modified examples of the present invention can be carried out on the basis of the foregoing explanation. Therefore, the present invention can be carried out in modes other than the above-mentioned best modes within the scope equivalent to the following claims.

What is claimed is:

1. A laminated semiconductor substrate laminated a plurality of semiconductor substrates having a plurality of scribe-groove parts formed along scribe lines, the plurality of semiconductor substrates each comprising:
a plurality of device regions insulated from each other, each of which is in contact with at least one of the plurality of scribe-groove parts and has a semiconductor device formed therein; and
a first wiring electrode and a second wiring electrode which are connected to the respective semiconductor devices in a first device region and a second device region adjacent to each other with at least one interposed groove part of the plurality of scribe-groove parts among the plurality of device regions, and extend to the inside of the interposed groove part from the first device region and the second device region respectively, and are separated from each other, and the laminated semiconductor substrate comprising:
a through hole formed therein which penetrates the interposed groove parts of the plurality of semiconductor substrates laminated in a laminated direction in which the plurality of semiconductor substrates are laminated, and in which a plurality of the first wiring electrodes, constituting a laminated electrode group laminated in the laminated direction among the first wiring electrodes, appear;
a through electrode which penetrates all of the plurality of semiconductor substrates through the through hole and is in contact with all of the first wiring electrodes appearing in the through hole; and
a plurality of laminated chip regions each of which is composed of the device regions laminated in the laminated direction in all of the plurality of semiconductor substrates.

2. The laminated semiconductor substrate according to claim 1, wherein where the first wiring electrodes having a common position among the first wiring electrodes in each of the plurality of semiconductor substrates are common wiring electrodes, the laminated electrode group is composed of the common wiring electrodes identical, regarding all of the plurality of semiconductor substrates.

3. The laminated semiconductor substrate according to claim 2, wherein the first wiring electrode has an electrode pad disposed inside of the interposed groove part and having a hole part formed along the laminated direction, and
wherein the through hole is formed in a straight line connecting all of the hole parts formed in the respective electrode pads of the plurality of the first wiring electrodes constituting the laminated electrode group.

4. The laminated semiconductor substrate according to claim 2,
wherein the plurality of scribe-groove parts are formed as through groove parts reaching a rear surface from a front surface of the semiconductor substrate, and further comprise an in-groove insulating layer formed inside of the scribe-groove parts, and
wherein the through hole is formed in a straight line penetrating all of the hole parts formed in the respective electrode pads of the plurality of the first wiring electrodes constituting the laminated electrode group, and the in-groove insulating layers laminated in the laminated direction of all of the semiconductor substrates.

5. The laminated semiconductor substrate according to claim 4,
wherein the whole inner surfaces facing the hole parts of the electrode pads are in contact with a peripheral surface of the through electrode, regarding all of the plurality of semiconductor substrates.

6. The laminated semiconductor substrate according to claim 5,
wherein the electrode pad is formed in a rectangular shape or in a U-shape disposed such that both end parts open toward the inside of the interposed groove part.

7. The laminated semiconductor substrate according to claim 1,
wherein the first wiring electrode and the second wiring electrode are formed such that each of the first wiring electrode and the second wiring electrode has an electrode pad or a terminal part extending to the inside of the interposed groove part, and endmost parts of the electrode pads or the terminal parts extending to the innermost of the interposed groove part are opposed to each other.

8. The laminated semiconductor substrate according to claim 1,
wherein the first wiring electrode has an electrode pad having a hole part formed along the laminated direction, and the through hole is formed along the hole part.

9. The laminated semiconductor substrate according to claim 1,
wherein the laminated semiconductor substrate is composed by laminating one or two or more unit laminated substrates in each of which four semiconductor substrates are laminated.

10. A laminated chip package, comprising:
a plurality of laminated semiconductor chips having a semiconductor device, each of the plurality of semiconductor chips including:
a resin insulating layer made of an insulating resin formed to surround the semiconductor chip; and
a wiring electrode which is connected to the semiconductor device and has an end part disposed on the resin insulating layer;
a through hole having a uniform thickness formed therein which penetrates the resin insulating layers of the plurality of semiconductor chips laminated in a laminated direction in which the plurality of semiconductor chips are laminated, and in which a plurality of the wiring electrodes, constituting a laminated electrode group laminated in the laminated direction among the wiring electrodes, appear; and
a through electrode having a uniform width which penetrates all of the plurality of semiconductor chips through the through hole and is in contact with all of the wiring electrodes appearing in the through hole.

11. The laminated chip package according to claim 10,
wherein a plurality of the wiring electrodes are formed on the resin insulating layer, and
wherein where the wiring electrodes having a common position among the wiring electrodes in each of the plurality of semiconductor chips are common wiring electrodes, the laminated electrode group is composed of the common wiring electrodes identical, regarding all of the plurality of semiconductor chips.

12. The laminated chip package according to claim 11, further comprising:
a rear electrode pad connected to the through electrode, formed on a rear side of the laminated chip package,
wherein the wiring electrode has an electrode pad disposed on the front side of the laminated chip package and having a hole part formed along the laminated direction, and
wherein the through hole is formed in a straight line connecting all of the hole parts formed in the respective electrode pads of the plurality of the wiring electrodes constituting the laminated electrode group and a top surface of the through electrode is adjacent to the electrode pad disposed on a front side of the laminated chip package.

13. The laminated chip package according to claim 11,
wherein the wiring electrode has an electrode pad disposed on the resin insulating layer and having a hole part formed along the laminated direction, and
wherein the through hole is formed in a straight line penetrating all of the hole parts formed in the respective electrode pads of the plurality of the wiring electrodes constituting the laminated electrode group, and the resin insulating layers laminated in the laminated direction of all of the semiconductor chips.

14. The laminated chip package according to claim 13,
wherein the whole inner surfaces facing the hole parts of the electrode pads are in contact with a peripheral surface of the through electrode, regarding all of the plurality of semiconductor chips.

15. The laminated chip package according to claim 10,
wherein the wiring electrode has an electrode pad having a hole part formed along the laminated direction, and the through hole is formed along the hole part.

16. A method of manufacturing a laminated semiconductor substrate, comprising:
a device region forming step of forming a plurality of scribe-groove parts along scribe lines in an unprocessed substrate having semiconductor devices formed therein to form a plurality of device regions each of which is in contact with at least one of the plurality of scribe-groove parts and has the semiconductor device formed therein;
a substrate manufacturing step of manufacturing a substrate with electrode by forming a first wiring electrode and a second wiring electrode which are connected to the respective semiconductor devices in a first device region and a second device region adjacent to each other with at least one interposed groove part of the plurality of scribe-groove parts among the plurality of device regions, and extend to the inside of the interposed groove part from the first device region and the second device region respectively, and are separated from each other;
a laminating step of laminating a plurality of the substrates with electrode to manufacture a laminated wafer;
a through hole forming step of forming, in the laminated wafer, a through hole which penetrates the interposed groove parts of the plurality of substrates with electrode laminated in a laminated direction in which the plurality of substrates with electrode are laminated, and in which a plurality of the first wiring electrodes, constituting a laminated electrode group laminated in the laminated direction among the first wiring electrodes, appear; and a through electrode forming step of forming a through electrode in contact with all of the first wiring electrodes appearing in the through hole such that the through electrode penetrates all of the plurality of substrates with electrode through the through hole.

17. The method of manufacturing a laminated semiconductor substrate according to claim 16, wherein in the substrate manufacturing step, the first wiring electrode and the second wiring electrode are formed such that each of the first wiring electrode and the second wiring electrode has an electrode pad or an extended terminal part extending to the inside of the interposed groove part, and endmost parts of the electrode pads or the extended terminal parts extending to the innermost of the interposed groove part are opposed to each other.

18. The method of manufacturing a laminated semiconductor substrate according to claim 17, further comprising:

an insulating layer forming step of forming an in-groove insulating layer made of an insulating resin inside the plurality of scribe-groove parts, and wherein in the through hole forming step, the through hole is formed in a straight line penetrating all of the hole parts formed in the respective electrode pads of the plurality of the first wiring electrodes constituting the laminated electrode group, and the in-groove insulating layers laminated in the laminated direction of all of the semiconductor substrates.

19. The method of manufacturing a laminated semiconductor substrate according to claim 16, wherein in the substrate manufacturing step, the first wiring electrode is formed in a shape having an electrode pad disposed inside the interposed groove part and having a hole part formed along the laminated direction, and wherein in the through hole forming step, the through hole is formed in a straight line connecting all of the hole parts formed in the respective electrode pads of the plurality of the first wiring electrodes constituting the laminated electrode group.

20. The method of manufacturing a laminated semiconductor substrate according to claim 19, wherein in the through hole forming step, the through hole is formed such that the whole inner surfaces facing the hole parts of the electrode pads appear in the through hole.

21. A method of manufacturing a laminated chip package, comprising the step of:

cutting the laminated semiconductor substrate manufactured by the manufacturing method according to claim 16 along the scribe-groove parts to cause resin insulating layers made of an insulating resin to appear in a cut surface to manufacture laminated chip packages.

22. The method of manufacturing a laminated chip package according to claim 21, wherein when cutting the laminated semiconductor substrate, the cutting is performed in a space between the first wiring electrodes and the second wiring electrodes in the laminated semiconductor substrate.

\* \* \* \* \*